(12) United States Patent
Tanaka et al.

(10) Patent No.: US 8,335,110 B2
(45) Date of Patent: Dec. 18, 2012

(54) SEMICONDUCTOR MEMORY, SYSTEM, AND METHOD OF CONTROLLING SEMICONDUCTOR MEMORY

(75) Inventors: Kengo Tanaka, Yokohama (JP); Osamu Iioka, Ogaki (JP); Shuji Iioka, legal representative, Ogaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 245 days.

(21) Appl. No.: 12/850,470

(22) Filed: Aug. 4, 2010

(65) Prior Publication Data

US 2011/0032767 A1 Feb. 10, 2011

(30) Foreign Application Priority Data

Aug. 7, 2009 (JP) .................................. 2009-184386

(51) Int. Cl.
*G11C 11/34* (2006.01)
(52) U.S. Cl. ......... 365/185.18; 365/185.21; 365/185.22; 365/185.24; 365/185.29; 365/185.33
(58) Field of Classification Search ............. 365/185.18, 365/185.21, 185.22, 185.24, 185.29, 185.33
See application file for complete search history.

(56) References Cited

U.S. PATENT DOCUMENTS

| | | | | |
|---|---|---|---|---|
| 5,745,410 A * | 4/1998 | Yiu et al. | ................. | 365/185.18 |
| 5,912,845 A * | 6/1999 | Chen et al. | ................ | 365/185.18 |
| 6,438,037 B1 * | 8/2002 | Fastow et al. | ............ | 365/185.22 |
| 6,483,752 B2 | 11/2002 | Hirano | | |
| 6,490,201 B2 | 12/2002 | Sakamoto | | |
| 6,532,175 B1 * | 3/2003 | Yachareni et al. | ........ | 365/185.22 |
| 6,683,810 B2 | 1/2004 | Sakamoto | | |
| 7,151,694 B2 * | 12/2006 | Meihong et al. | ......... | 365/185.22 |
| 7,453,724 B2 * | 11/2008 | Lee et al. | ................. | 365/185.18 |
| 7,835,194 B2 * | 11/2010 | Aritome | ................... | 365/185.33 |
| 8,031,528 B2 * | 10/2011 | Melik-Martirosian et al. | ........................ | 365/185.22 |
| 8,036,041 B2 * | 10/2011 | Li | ............................. | 365/185.21 |
| 8,081,519 B2 * | 12/2011 | Lee et al. | ................. | 365/185.29 |
| 2002/0008996 A1 | 1/2002 | Hirano | | |
| 2002/0057598 A1 | 5/2002 | Sakamoto | | |
| 2003/0053356 A1 | 3/2003 | Sakamoto | | |

FOREIGN PATENT DOCUMENTS

| | | |
|---|---|---|
| JP | 5-314783 A | 11/1993 |
| JP | 2002-25280 A | 1/2002 |
| JP | 2002-109891 A | 4/2002 |

* cited by examiner

*Primary Examiner* — Trong Phan
(74) *Attorney, Agent, or Firm* — Arent Fox LLP

(57) ABSTRACT

A semiconductor memory includes: a non-volatile memory cell including a floating gate and a memory transistor; a state machine that generates a normal program signal for performing a normal program operation and a verify signal for performing a verify operation and generates a soft program signal for performing a soft program operation when detecting a fail in the verify operation after the normal program operation, whether a threshold voltage of the memory transistor reaches a value being checked in the verify operation; a voltage generating circuit that generates a normal program voltage and a verify voltage based on the normal program signal and the verify signal and generates a soft program voltage based on the soft program signal; and a determination circuit that detects a pass when the threshold voltage reaches the value and detects the fail when the threshold voltage does not reach the value.

14 Claims, 25 Drawing Sheets

FIG. 6

|    | SPGM     | PGM0-2           | VRFY0-2         |
|----|----------|------------------|-----------------|
| CG | VSP0     | VPG0,VPG1,VPG2   | VVF0,VVF1,VVF2  |
| SG | VSGP     | VSGP             | VSGV            |
| BL | VSS (0V) | VSS (0V)         | VDV             |
| SL | VS       | VS               | 0V              |

FIG. 15

|    | SPGM0-2         | PGM0-2            | VRFY0-2         |
|----|-----------------|-------------------|-----------------|
| CG | VSP0,VSP1,VSP2  | VPG0,VPG1,VPG2    | WF0,WF1,WF2     |
| SG | VSGP            | VSGP              | VSGV            |
| BL | 0V              | 0V                | VDV             |
| SL | VS              | VS                | 0V              |

FIG. 23

|  | SPGM | PGM0-2 | VRFY0-2 |
|---|---|---|---|
| CG | VSP0 | VSG0,VPG1,VPG2 | VWF0,VWF1,VVF2 |
| BL | VDP | VDP | VDV |
| SL | 0V | 0V | 0V |

SEMICONDUCTOR MEMORY, SYSTEM, AND METHOD OF CONTROLLING SEMICONDUCTOR MEMORY

CROSS-REFERENCE TO RELATED APPLICATIONS

This application claims the benefit of priority from Japanese Patent Application No. 2009-184386 filed on Aug. 7, 2009, the entire contents of which are incorporated herein by reference.

BACKGROUND

1. Field

The embodiments discussed herein relate to a semiconductor memory.

2. Description of Related Art

A semiconductor memory, such as a flash memory, may store data logic according to a threshold voltage of a memory transistor within a memory cell. The threshold voltage of the memory transistor varies depending on an amount of charges stored in a floating gate. When data is programmed into a memory cell that is in an erased state, the control gate of the memory transistor is set to a high level in order to generate a hot electron in a channel region of the memory cell transistor. The threshold voltage of the memory transistor is high because the hot electron is injected into the floating gate of the memory transistor.

Related art is disclosed in Japanese Laid-open Patent Publication No. H5-314783, Japanese Laid-open Patent Publication No. 2002-25280, Japanese Laid-open Patent Publication No. 2002-109891, or the like.

SUMMARY

According to one aspect of the embodiments, a semiconductor memory is provided which includes: a non-volatile memory cell configured to include a floating gate and a memory transistor; a state machine configured to generate a normal program signal to perform a normal program operation and a verify signal to perform a verify operation in a write operation and to generate a soft program signal to perform a soft program operation when detecting a fail in the verify operation after the normal program operation, whether a threshold voltage of the memory transistor reaches a certain value in the normal program operation being checked in the verify operation; a voltage generating circuit configured to generate a normal program voltage and a verify voltage in response to the normal program signal and the verify signal respectively, and to generate a soft program voltage being lower than the normal program voltage in response to the soft program signal; and a determination circuit configured to detect a pass when the threshold voltage reaches the certain value and detects the fail when the threshold voltage does not reach the certain value in the verify operation.

Additional advantages and novel features of the invention will be set forth in part in the description that follows, and in part will become more apparent to those skilled in the art upon examination of the following or upon learning by practice of the invention.

BRIEF DESCRIPTION OF THE DRAWINGS

FIG. 6 illustrates an exemplary internal voltage;
FIG. 15 illustrates an exemplary inner voltage;
FIG. 23 illustrates an exemplary internal inner voltage.

DESCRIPTION OF EMBODIMENTS

A threshold voltage of a memory transistor in an erased state may be distributed in a certain width, so an overdrive voltage may vary. The overdrive voltage indicates an effective program voltage in which a threshold voltage is subtracted from a voltage at a control gate. For a memory transistor with a low threshold voltage in an erased state, an overdrive voltage in a write operation may be high. If the overdrive voltage is high, a change in threshold voltage is small. For such a memory transistor with a low threshold voltage in an erased state, many program operations may be performed.

Figure 1:
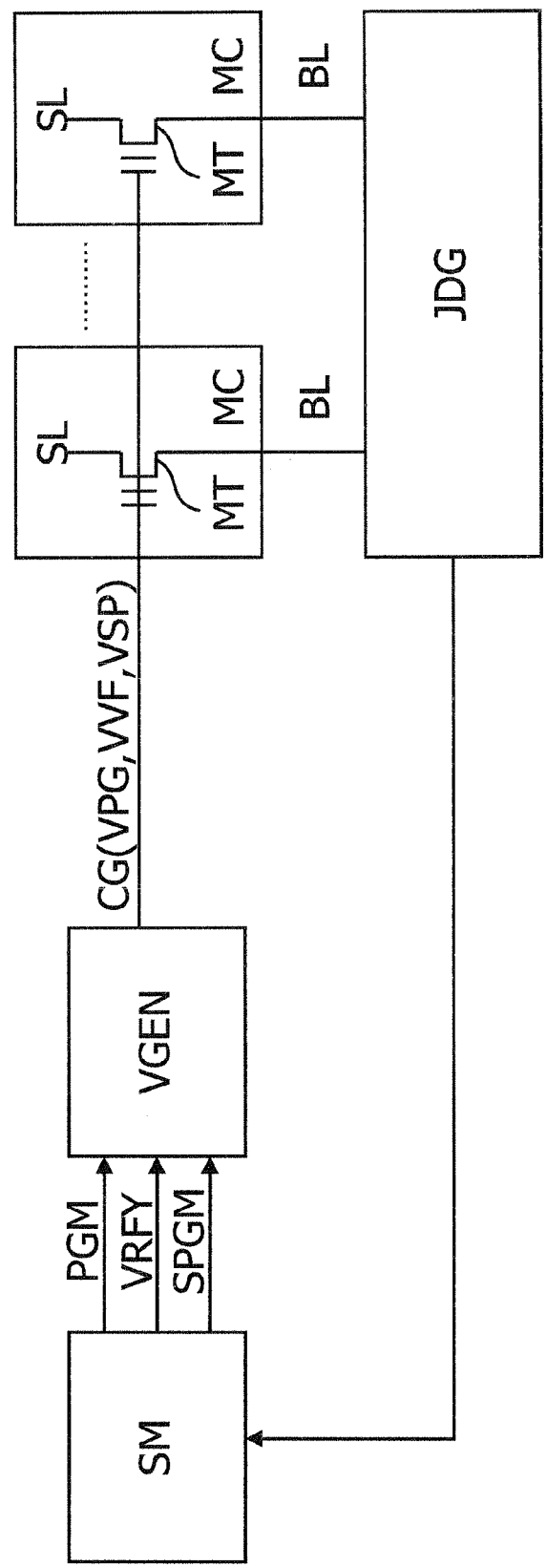
FIG. 1 illustrates an exemplary semiconductor memory.

FIG. 1 illustrates an exemplary semiconductor memory. For example, a semiconductor memory MEM may include a nonvolatile semiconductor memory, such as a flash memory. The semiconductor memory MEM may include at least one nonvolatile memory cell MC, a state machine SM, a voltage generating circuit VGEN, and a determination circuit JDG. The memory cell MC includes a memory transistor MT. The source and drain of the memory transistor MT are coupled to a source line SL and a bit line BL. The control gate of the memory transistor MT is coupled to a common control gate line CG. The threshold voltage of the memory transistor MT changes in response to a control gate voltage supplied to the control gate line CG, and data is stored in accordance with the threshold voltage.

The state machine SM generates a normal program signal PGM or a verify signal VRFY in a write operation for setting the threshold voltage of the memory transistor MT at a certain value. The normal program signal PGM and the verify signal VRFY may be alternately generated until a pass is determined in a verify operation. The state machine SM generates a soft program signal SPGM for performing a soft program operation when a fail is determined by a verify operation after a normal program operation.

The voltage generating circuit VGEN generates a normal program voltage VPG and a verify voltage VVF, as a control gate voltage CG, in response to the normal program signal PGM and the verify signal VRFY, respectively. The voltage generating circuit VGEN generates a soft program voltage VSP lower than the normal program voltage VPG as the control gate voltage CG in response to the soft program signal SPGM. In a verify operation, the determination circuit JDG determines a pass when the threshold voltage of the memory transistor MT reaches a certain value and determines a fail when the threshold voltage does not reach the certain value. The determination may be fed back to the state machine SM.

In a soft program operation, a control gate voltage CG lower than that in a normal program operation is supplied to the memory transistor MT. The overdrive voltage applied to the memory transistor MT in an erased state may be relatively low. For a memory transistor MT having a low threshold voltage in an erased state, the amount of changes in threshold voltage may be increased by a reduction in the overdrive voltage. For a memory transistor MT having a threshold voltage that is positioned at an end of distribution, the amount of changes in threshold voltage is increased by a reduction in the overdrive voltage. The number of times of a normal program operation and a verify operation may be reduced. The time required for a write operation may be reduced, and the performance of the semiconductor memory MEM may be improved.

Figure 2:
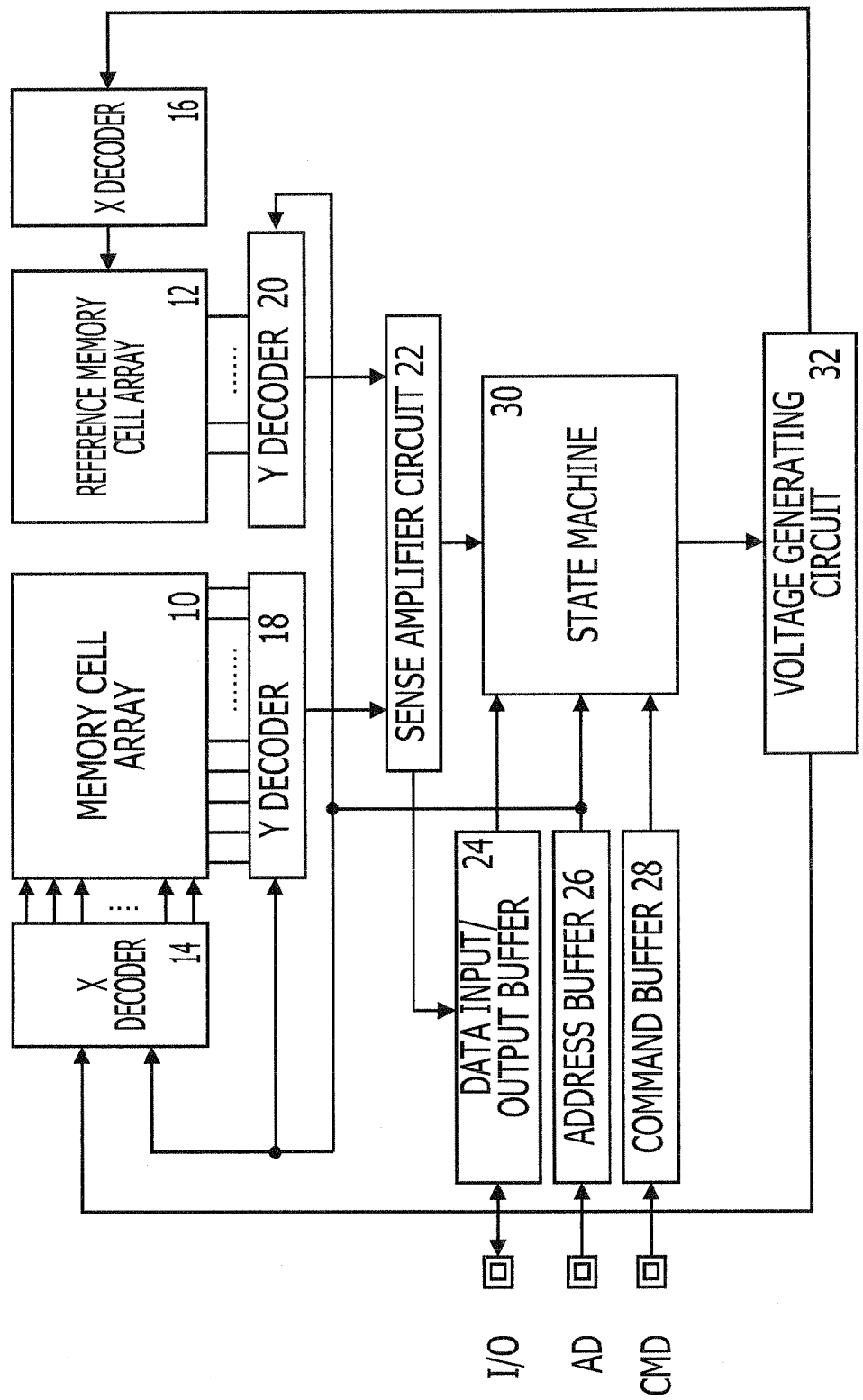
FIG. 2 illustrates an exemplary semiconductor memory.

FIG. 2 illustrates an exemplary semiconductor memory. In the drawing, a double rectangle sign indicates an external terminal. The external terminal may include a pad on a semiconductor chip or a lead of a package in which a semiconductor chip is accommodated, for example. A signal supplied through the external terminal has the same reference as that for the terminal.

For example, the semiconductor memory MEM may be a nonvolatile semiconductor memory, such as a flash memory. The semiconductor memory MEM includes a memory cell array 10, a reference memory cell array 12, X decoders 14 and 16, Y decoders 18 and 20, a sense amplifier circuit 22, a data input/output buffer 24, an address buffer 26, a command buffer 28, a state machine 30, and a voltage generating circuit 32.

The memory cell array 10 includes nonvolatile memory cells arranged in a matrix. The reference memory cell array 12 includes a plurality of reference memory cells each having a previously set threshold voltage. For example, the configuration of each of the reference memory cells is substantially the same as or similar to that of the memory cell MC in the memory cell array 10.

Figure 3:
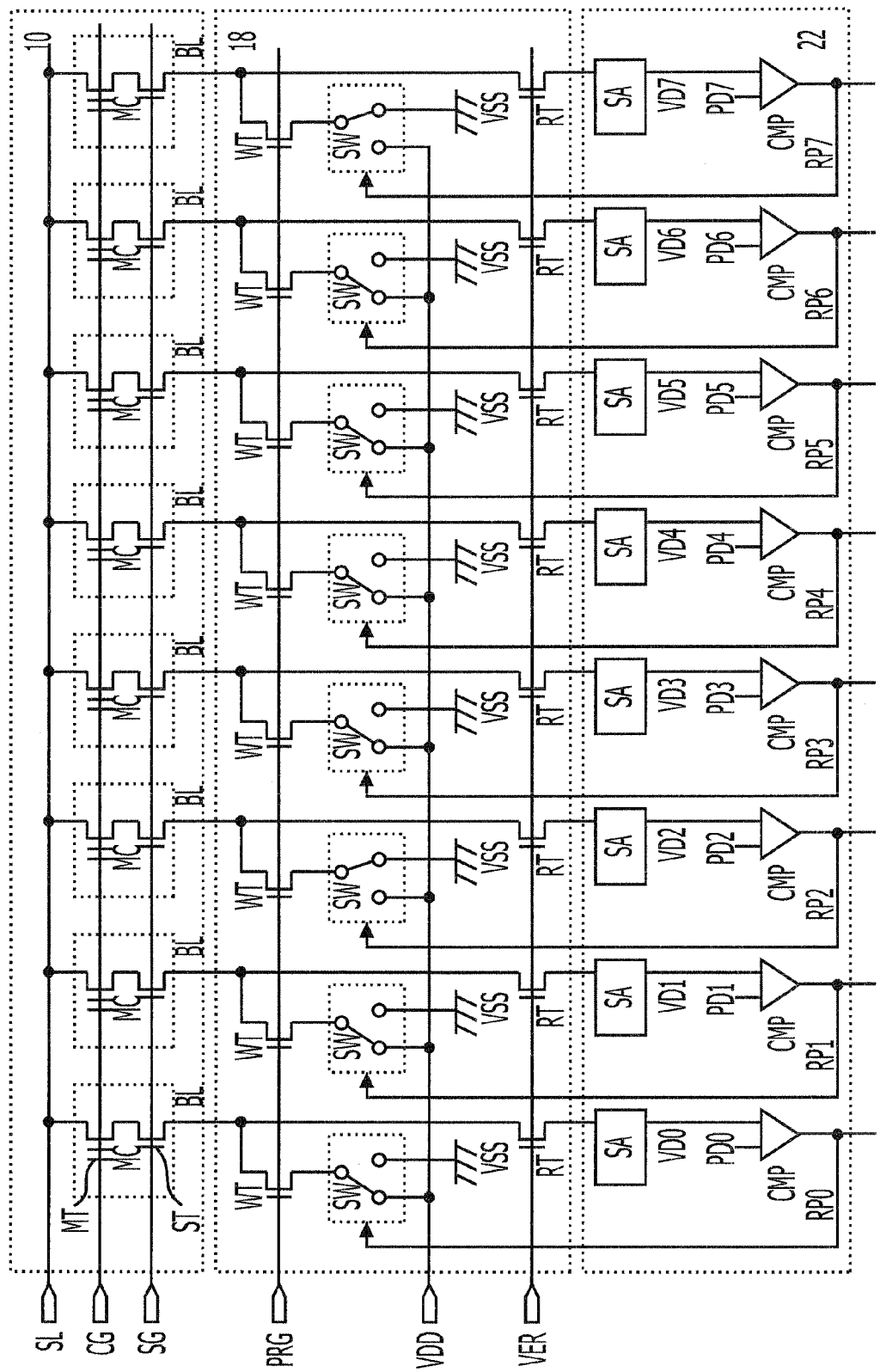
FIG. 3 illustrates an exemplary memory cell array, an exemplary Y decoder, and an exemplary sense amplifier.

The X decoder 14 decodes an address signal AD supplied through the address buffer 26, for example, a row address signal and selects the control gate line CG, a selection gate line SG, and the source line SL illustrated in FIG. 3. Each of the selected control gate line CG, selection gate line SG, and source line SL is set at the control voltage generated by the voltage generating circuit 32. The X decoder 16 outputs the control voltage from the voltage generating circuit 32 to the reference memory cell MC.

The Y decoder 18 decodes an address signal AD, for example, a column address signal and selects a bit line BL corresponding to a memory cell MC to be accessed illustrated in FIG. 3. The Y decoder 20 decodes an address signal AD, for example, a column address signal and selects a reference bit line corresponding to a bit line BL coupled to a memory cell MC to be accessed. The sense amplifier circuit 22 includes a sense amplifier for amplifying the voltage level of each of the bit line BL and the reference bit line and a comparator for comparing the amplified voltage levels.

In a read operation, the data input/output buffer 24 outputs read data output from the sense amplifier circuit 22 to a data terminal I/O. When writing the logic "0" into a memory cell MC, the data input/output buffer 24 outputs a data signal supplied to the data terminal I/O to the state machine 30. When erasing of setting the logic "1" in a memory cell MC, the data input/output buffer 24 outputs a data signal supplied to the data terminal I/O to the state machine 30. If a certain number of memory cells MC is erased at a time, no data signal may be supplied to the data input/output buffer 24.

In a read operation, a write operation, and a erase operation, the address buffer 26 receives an address signal AD and outputs the address signal AD to the X decoders 14 and 16, the Y decoders 18 and 20, and the state machine 30. The command buffer 28 receives a command signal CMD and outputs the command signal CMD to the state machine 30. The command signal CMD includes a read command, a write command, or an erase command.

The state machine 30 outputs a control signal to the voltage generating circuit 32 in order to read data from a memory cell MC or set the logic "0" or the logic "1" in the memory cell MC. For example, in a write operation of setting the logic "0" in the memory cell MC or an erase operation of setting the logic "1" in the memory cell MC, the state machine 30 monitors the threshold voltage of the selected memory cell MC based on output from the sense amplifier circuit 22. In response to a result of the monitoring, the state machine 30 outputs a control signal to the voltage generating circuit 32. Control of the state machine 30 is repeated until the selected memory cell MC is set at a certain threshold voltage. A write operation may include a normal program operation, a verify operation, or a soft program operation.

In response to a control signal from the state machine 30, the voltage generating circuit 32 generates a control voltage to be supplied to each of the control gate line CG, selection gate line SG, and source line SL of the memory cell array 10 and a control voltage to be supplied to the reference memory cell array 12.

FIG. 3 illustrates an exemplary memory cell array, an exemplary Y decoder, and an exemplary sense amplifier. The memory cell array 10, the Y decoder 18, and the sense amplifier circuit 22 illustrated in FIG. 3 may be the memory cell array 10, the Y decoder 18, and the sense amplifier circuit 22 illustrated in FIG. 2, respectively. For example, in a read operation, a comparator CMP generates a voltage corresponding to data in a memory cell MC in response to a voltage VD corresponding to a current flowing through a bit line BL.

The memory cell array 10 includes a plurality of nonvolatile memory cells MC arranged in a matrix. The source line SL, the control gate line CG, and the selection gate line SG are commonly coupled to rows of the memory cells MC aligned in a horizontal direction in FIG. 3. The memory cell array 10 may include a plurality of memory cell groups. Each of the memory cells MC of the memory cell groups may be coupled to a common bit line BL. The selection gate line SG is set at a high level, and a memory cell group is selected. A number of bit lines BL may be arbitrary.

Each of the memory cells MC includes a memory transistor MT and a selection transistor ST arranged in series between the source line SL and the associated bit line BL. The configuration of the memory transistor MT is substantially the same as or similar to that of an n-channel metal-oxide semiconductor (nMOS) transistor. The memory transistor MT has a floating gate that accumulates electrons and a control gate coupled to the control gate line CG. The memory transistor MT may include a trap gate in which electrons are accumulated in a certain place. The amount of charges accumulated in the floating gate varies with the control gate voltage CG applied to the control gate, and the threshold voltage of the memory transistor MT varies. The memory transistor MT stores data logic depending on the threshold voltage. The selection transistor ST may be an nMOS transistor having a gate coupled to the selection gate line SG. The memory transistor MT is coupled to the bit line BL by the selection, transistor ST being turned on.

The Y decoder 18 includes a writing transistor WT, a switching circuit SW, and a reading transistor RT for each bit line BL. The writing transistor WT includes a gate coupled to a program signal line PRG, a source coupled to the bit line BL, and a drain coupled to the switching circuit SW. The program signal line PRG from the state machine 30 turns on the writing transistor WT during a normal program operation.

When receiving an activated re-program signal RP (RP0-RP7) during the normal program operation and during the soft program operation, the switching circuit SW couples the bit line EL to a ground line VSS. When receiving a deactivated re-program signal RP (RP0-RP7) during the normal program operation and during the soft program operation, the switching circuit SW couples the bit line BL to a power supply line VDD. The active level of the re-program signal RP indicates determination of a fail made by a verify operation. The inactive level of the re-program signal RP indicates determination of a pass made by a verify operation.

In FIG. 3, the memory transistors MT corresponding to the switching circuits SW coupled to the power supply line VDD exceed a threshold voltage for a write state, and a pass is determined by a verify operation. The threshold voltage may be a minimum. For each of the memory transistors MT determined to pass, in the normal program operation and the soft program operation for other subsequent memory transistors MT, no program voltage may be applied between the source and the drain. Since the memory transistors MT corresponding to the switching circuits SW coupled to the ground line VSS do not reach the threshold voltage for the write state, a fail is determined by a verify operation. For each of the memory transistors MT determined to fail, in the normal program operation and the soft program operation for other subsequent memory transistors MT, a program voltage may be applied between the source and the drain.

For example, the switching circuit SW may include a program mask circuit. The program mask circuit prohibits a program voltage from being applied between the source and the drain of the memory transistor MT. When the sense amplifier circuit 22 detects determination of a pass for a memory transistor MT, the program mask circuit prohibits a program voltage from being applied to the memory transistor MT in the normal program operation and the soft program operation.

The reading transistor RT has a gate coupled to a verify signal line VER, a source coupled to the bit line BL, and a drain coupled to the sense amplifier. The verify signal line VER from the state machine 30 turns on the reading transistor RT in a verification during the write operation, a verification during an erasing operation, and during a read operation.

The sense amplifier circuit 22 includes the sense amplifier SA and the comparator CMP for each bit line BL. The sense amplifier SA converts a current flowing through the bit line BL via the reading transistor RT into a voltage and outputs the voltage as verify data VD (VD0-VD7) to the comparator CMP. In a verify operation, the comparator CMP compares the voltage of the verify data VD (VD0-VD7) and that of program data PD (PD0-PD7) and outputs a comparison result as the re-program signal RP (RP0-RP7). For example, a reference current supplied from a verify reference memory cell through the Y decoder 20 illustrated in FIG. 2 is converted by the reference sense amplifier into a voltage, and the program data PD is generated.

For example, in a verify operation, when the threshold voltage of the memory transistor MT is set at a certain value or in a certain range, the sense amplifier SA and the comparator CMP detect a pass and outputs an inactive-level re-program signal RP (RP0-RP7). In the verify operation, when the threshold voltage of the memory transistor MT does not reach a certain value or a certain range, the sense amplifier SA and the comparator CMP detect a fail and outputs an active-level re-program signal RP (RP0-RP7). For example, in the verify operation, the sense amplifier SA and the comparator CMP may determine a pass when the threshold voltage reaches a certain value and may determine a fail when the threshold voltage does not reach the certain value.

Figure 4:
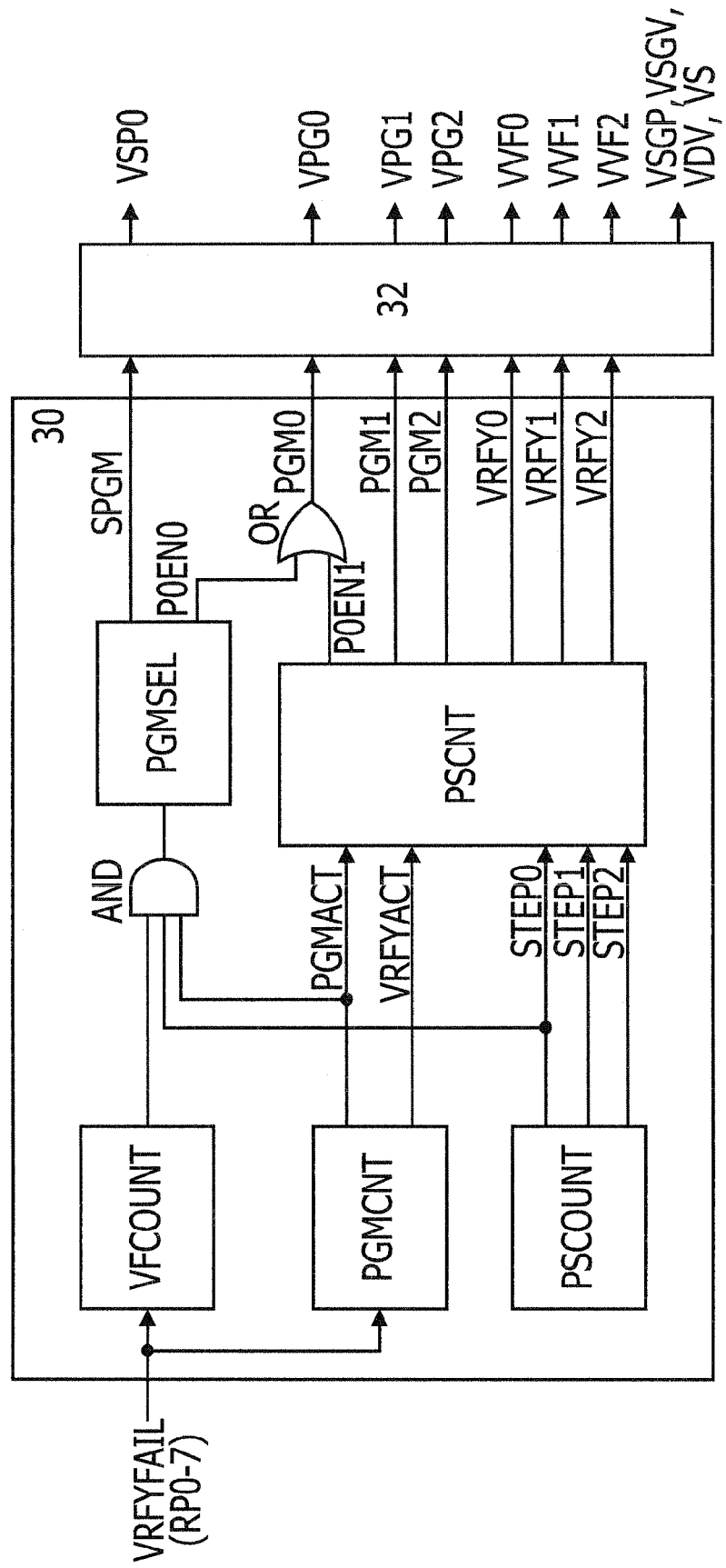
FIG. 4 illustrates an exemplary state machine.

FIG. 4 illustrates an exemplary state machine. The state machine illustrated in FIG. 4 may be the state machine 30 illustrated in FIG. 2. In FIG. 4, a write operation may be performed. The state machine 30 includes a verify fail counter VFCOUNT, a program control circuit PGMCNT, a program step counter PSCOUNT, an AND circuit, a program selector PGMSEL, a program step control circuit PSCNT, and an OR circuit.

In response to a verify fail signal VRFYFAIL, the verify fail counter VFCOUNT counts the number of fails in a verify operation. For example, the verify fail signal VRFYFAIL may be generated by OR logic of the re-program signal RP (RP0-RP7) from the sense amplifier circuit 22. When the verify fail signal VRFYFAIL indicates that a verify operation fails two or more times, the verify fail counter VFCOUNT outputs a high-level signal to the AND circuit.

In the normal program operation or the soft program operation, the program control circuit PGMCNT activates a program active signal PGMACT to a high level. In the verify operation during the write operation, the program control circuit PGMCNT activates a verify active signal VRFYACT to a high level.

The program step counter PSCOUNT outputs operation signals STEP0-STEP2 corresponding to three write operations. When a program operation PGM0, a verify operation VRFY0, and a soft program operation SPGM are performed, the operation signal STEP0 is activated to a high level. When a program operation PGM1 and a verify operation VRFY1 are performed, the operation signal STEP1 is activated to a high level. When a program operation PGM2 and a verify operation VRFY2 are performed, the operation signal STEP2 is activated to a high level. By the cycle of three executions of a write operation in the operations STEP0-STEP2, the logic "0" is written in the memory cell MC. The threshold voltage of the memory cell MC rises in three levels.

When two or more fails determined by a verify operation are detected during the normal program operation in the operation STEP0, the AND circuit outputs a high-level signal to the program selector PGMSEL. The program selector PGMSEL operates based on the high-level signal from the AND circuit and outputs the soft program signal SPGM and a program enable signal P0EN0. When a verify operation fails two or more times during the normal program operation in the operation STEP0, a soft program operation is inserted.

In response to the program active signal PGMACT, verify active signal VRFYACT, and operation signals STEP0-STEP2, the program step control circuit PSCNT outputs a program enable signal P0EN1, normal program signals PGM1-PGM2, and verify signals VRFY0-VRFY2. In the normal program operation in the operation STEP0, the high-level program enable signal P0EN1 is output. In a verify operation corresponding to the normal program operation in the operation STEP0, the high-level verify signal VRFY0 is output. In the normal program operation in the operation STEP1, the high-level normal program signal PGM1 is output. In a verify operation corresponding to the normal program operation in the operation STEP1, the high-level verify signal VRFY1 is output.

In the normal program operation in the operation STEP2, the high-level normal program signal PGM2 is output. In a verify operation corresponding to the normal program operation in the operation STEP2, the high-level verify signal VRFY2 is output. When the program enable signal P0EN0 or P0EN1 is at a high level, the OR circuit outputs a high-level normal program signal PGM0.

In response to the normal program signals PGM0-PGM2, the voltage generating circuit 32 generates normal program voltages VPG0-VPG2, respectively. In response to the verify signals VRFY0-VRFY2, the voltage generating circuit 32 generates verify voltages VVF0-VVF2, respectively. In response to the soft program signal SPGM, the voltage generating circuit 32 generates a soft program voltage VSP0 lower than the normal program voltage VPG0. The voltage generating circuit 32 generates voltages VSGP, VSGV, VDV, and VS to be supplied to the selection gate line SG, source line SL, and bit line BL.

Figure 5:
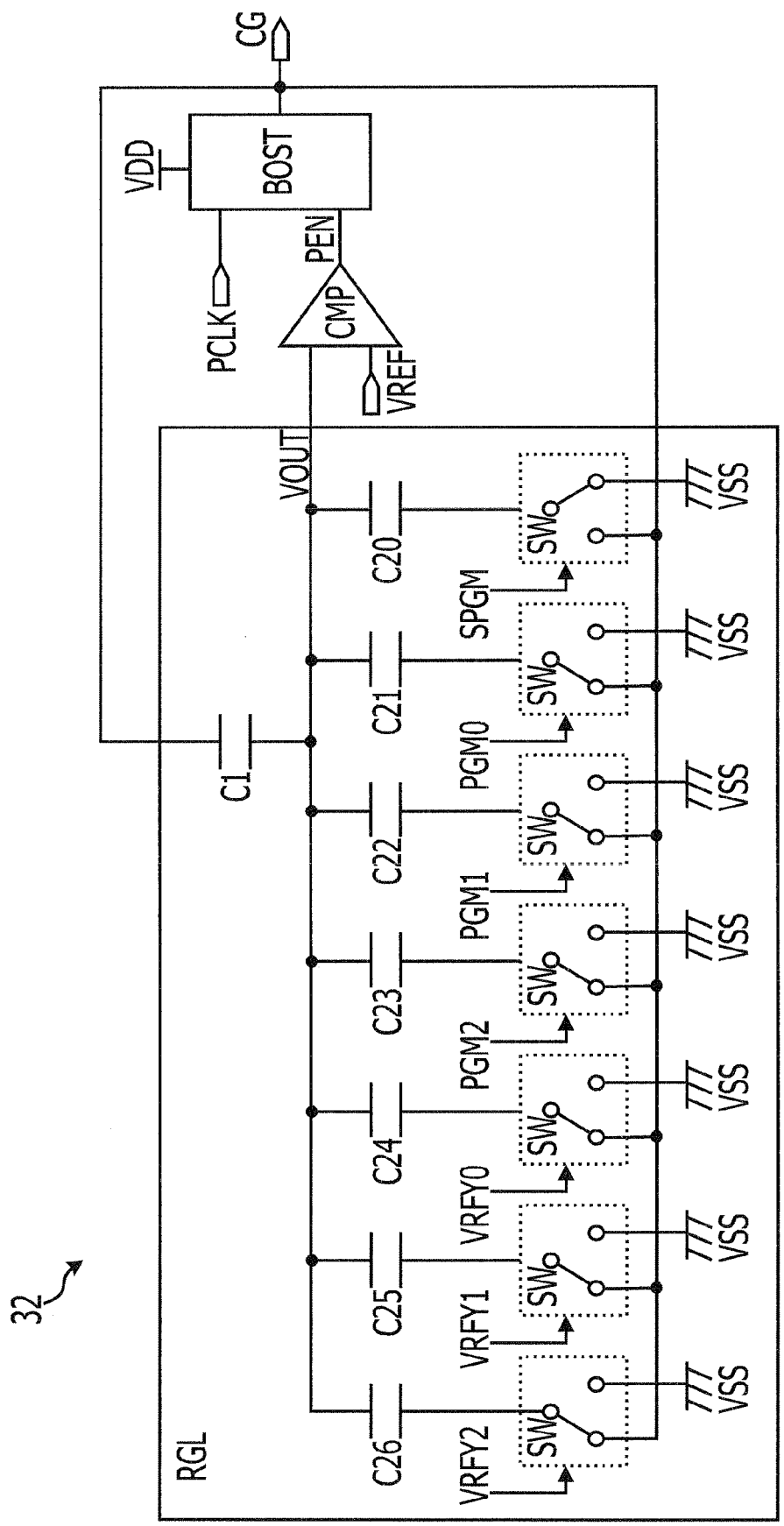
FIG. 5 illustrates an exemplary voltage generating circuit.

FIG. 5 illustrates an exemplary voltage generating circuit. The voltage generating circuit illustrated in FIG. 5 may be the voltage generating circuit 32 illustrated in FIG. 2. In FIG. 5, a program operation may be performed. The voltage generating circuit 32 includes a regulator RGL, a comparator CMP, and a voltage boost circuit BOST.

The regulator RGL includes switch circuits SW and capacitors C20-C26 corresponding to the soft program signal SPGM, normal program signals PGM0-PGM2, and verify signals VRFY0-VRFY2, respectively, and a capacitor C1. The capacitor C1 includes a first end coupled to the control gate voltage line CG and a second end coupled to a voltage output node VOUT of the regulator RGL. Each of the capacitors C20-C26 includes a first end coupled to a corresponding switching circuit SW and a second end coupled to the voltage output node VOUT.

When a corresponding control signal, for example, one of the soft program signal SPGM, normal program signals PGM0-PGM2, and verify signals VRFY0-VRFY2 are at a high level, each switching circuit SW couples an end of the corresponding capacitor, for example, one of the capacitors C20-C26 to the ground line VSS. The voltage VOUT corresponding to the capacity ratio between the capacitor C1 and a corresponding capacitor, for example, one of the capacitors C20-C26 is generated. Each of the switching circuits SW illustrated in FIG. 5 generates the control gate voltage CG for a soft program operation.

When the voltage VOUT is lower than the reference voltage VREF, the comparator CMP activates a pump enable signal. In response to the activated pump enable signal PEN, the voltage boost circuit BOST causes an incorporated pump circuit to operate in synchronization with a clock signal PCLK and generates the control gate voltage CG. The control gate voltage CG is supplied to the control gate line CG associated with a memory cell MC on which a program operation is to be performed.

When the control gate voltage CG becomes a certain value, the comparator CMP deactivates the pump enable signal PEN. The voltage boost circuit BOST stops a voltage boosting operation. Voltages for control gate lines CG corresponding to the soft program operation SPGM, program operations PGM0-PGM2, and verify operations VRFY0-VRFY2 are generated.

FIG. 6 illustrates an exemplary internal voltage. The internal voltage illustrated in FIG. 6 may be the internal voltage when the semiconductor memory illustrated in FIG. 2 operates. The internal voltage illustrated in FIG. 6 may be the internal voltage for a write operation. The voltages VSP0, VPG0-VPG2, and VVF0-VVF2 for the control gate line CG may be generated by the voltage generating circuit 32 illustrated in FIG. 5. The drain voltage VDV for the bit line BL and the source voltage VS for the source line SL may be generated by the voltage generating circuit 32.

In a soft program operation SPGM, the control gate line CG, selection gate line SG, bit line EL, and source line SL may be set at the voltages VSP0, VSGP, VSS (0 V), and VS, respectively. For example, the voltage VSGP supplied to the selection gate line SG may be the power supply voltage VDD, for example, approximately 1.8 volts. For example, the source voltage VS may be approximately 5 volts.

In normal program operations PGM0-PGM2, the control gate line CG is set at the voltage VPG0-VPG2, respectively, according to the operation numbers STEP0-STEP2. The selection gate line SG, bit line BL, and source line SL are set at the voltages VSGP, VSS (0 V), and VS, respectively.

In verify operations VRFY0-VRFY2, the control gate line CG is set at the voltages VVF0-VVF2, respectively, according to the operation numbers STEP0-STEP2. The selection gate line SG, bit line BL, and source line SL are set at the voltages VSGV, VDV, and VSS, for example, 0 volts, respectively. For example, the voltage VSGV supplied to the selection gate line SG may be approximately 1.8 volts. For example, the voltage VDV supplied to the bit line FL may be approximately 1.0 volts.

In the soft program operation SPGM and the normal program operation PGM, a selection transistor ST of a memory cell MC to be programmed is turned on, and a current flows from the source line SL to the bit line BL. A hot electron occurs in the channel region of the memory transistor MT to be programmed. Because the control gate line CG is at a high level, the hot electron is injected into the floating gate of the memory transistor MT and stored. The threshold voltage of the memory transistor MT may rise, and the logic of data stored in the memory cell MC may change from the logic "1" to the logic "0."

Figure 7:
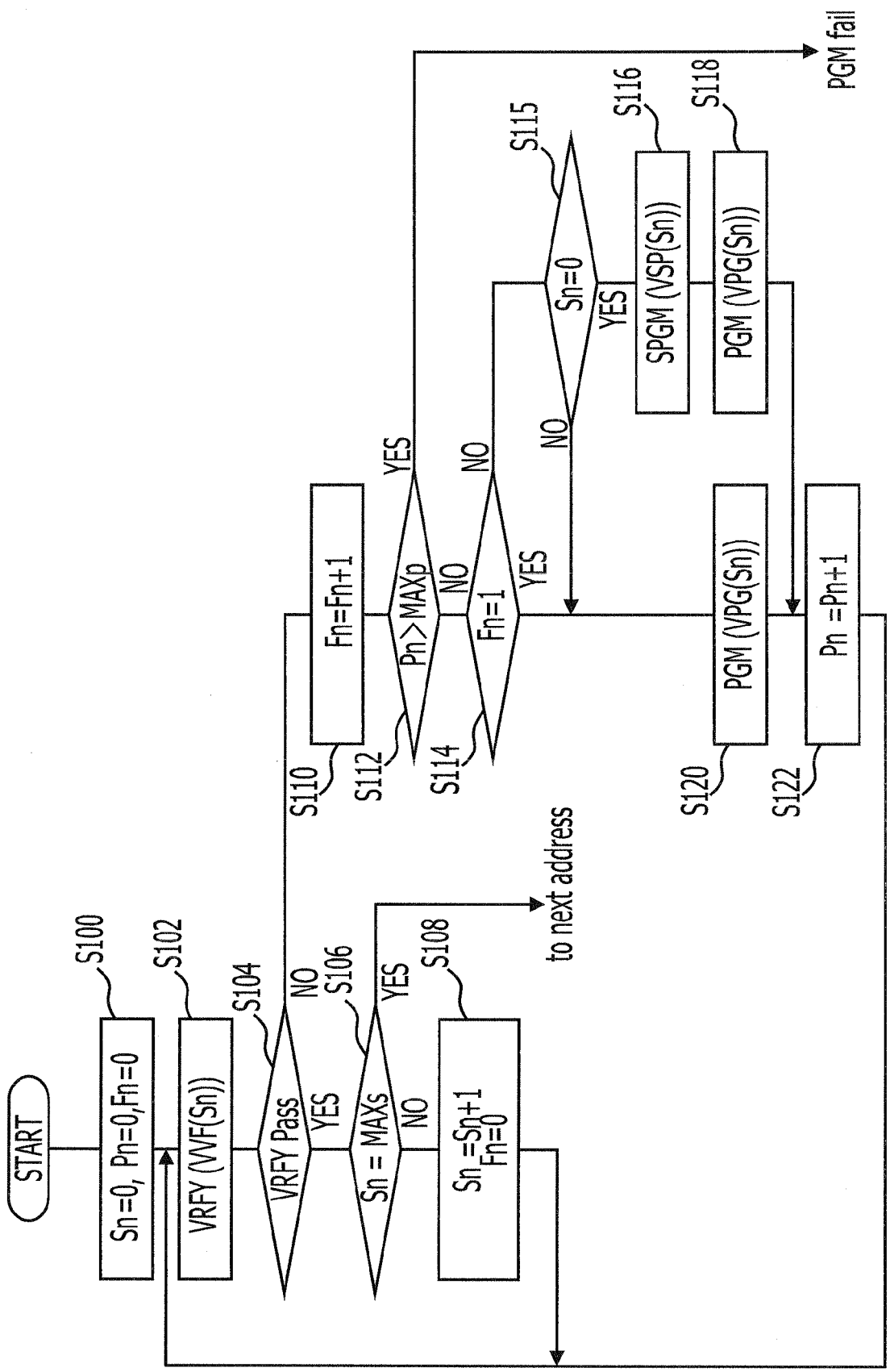
FIG. 7 illustrates an exemplary write operation.

FIG. 7 illustrates an exemplary write operation. The semiconductor memory illustrated in FIG. 2 may perform the write operation illustrated in FIG. 7. The write operation may include a verify operation VRFY (VRFY0-VRFY2), a program operation PGM (PGM0-PGM2), and a soft program operation SPGM. The soft program operation SPGM may not be included. The write operation illustrated in FIG. 7 may be controlled by the state machine 30.

In operation S100, the counter values Sn, Pn, and Fn are reset to "0." The counter value Sn indicates the operation number OP0, OP1, or OP2 in a write operation. The counter value Pn indicates the number of normal program operations PGM in each of the operations OP0-OP2. The counter value Fn indicates the number of fails in a verify operation VRFY in each of the operations OP0-OP2.

In operation S102, the control gate line CG is set at the verify voltage VVF(Sn), and the verify operation VRFY is performed. When the verify operation VRFY passes in operation S104, the process proceeds to operation S106. When the verify operation VRFY fails in operation S104, the process proceeds to operation S110.

When the operation number Sn is the maximum value MAXs in operation S106, a program for a next address is executed. When the operation number Sn does not reach the maximum value MAXs in operation S106, the process proceeds to operation S108. The maximum value MAXs indicating the maximum operation number Sn may be "2." A write operation may be divided into three write operational sections.

In operation S108, because the verify operation VRFY is passed, the operation number Sn is incremented by one to perform the next normal program operation PGM, and the number Fn of fails is reset to "0." The process proceeds to operation S102.

In operation S110, because the verify operation VRFY has failed, the number Fn of fails is incremented by one. When the number Pn of program operations exceeds the maximum value MAXp in operation S112, the write operation is determined to fail (PGM Fail). When the number Pn of program operations does not exceed the maximum value MAXp in operation S112, the process proceeds to operation S114 to perform the normal program operation PGM. The maximum value MAXp may be two. When the verify operation VRFY fails after the normal program operation PGM of the same operation number OP is performed three times, the write operation is not completed. The maximum value MAXp of the number Pn of program operations may be set so as avoid a fail of a write operation. Because the soft program operation SPGM is inserted, a fail of a write operation may reduce without increase of the maximum value MAXp for the number Pn of program operations.

When the number Fn of fails is one in operation S114, the process proceeds to operation S120 to perform the normal program operation PGM. When the number Fn of fails is two or more in operation S114, the process proceeds to operation S115.

When the operation number Sn is not "0" in operation S115, for example, when the normal program operations PGM1-PGM2 for the operations OP1-OP2 are performed, the process proceeds to operation S120. When the operation number Sn is "0" in operation S115, the process proceeds to operation S116 to perform the soft program operation SPGM and the normal program operation PGM.

The soft program operation SPGM may be performed in either the operation OP1 or OP2. The soft program operation SPGM may be inserted into the operations OP0-OP2. The operation OP into which the soft program operation SPGM is inserted may be determined depending on writing characteristics of a memory transistor MT.

For example, the number of normal program operations PGM may be reduced by insertion of the soft program operation SPGM into the operation OP1. The logic of the state machine 30 may be changed. The input of the AND circuit illustrated in FIG. 4 is coupled to the operation signal line STEP1, not to the operation signal line STEP0. The photomask of the uppermost wiring layer may be switched and the connection may be changed. The connection may be changed by a fuse circuit or a setting of mode register.

In operation S116, the control gate line CG is set at the soft program voltage VSP(Sn), and the soft program operation SPGM is performed. In operation S118, the control gate line CG is set at the normal program voltage VPG(Sn), and the normal program operation PGM is performed. In operation S120, from which the process will proceed to operation S122, the control gate line CG is set at the normal program voltage VPG(Sn), and the normal program operation PGM is performed. In operation S122, the number Pn of program operations is incremented by one, and the process proceeds to operation S102.

Figure 8:
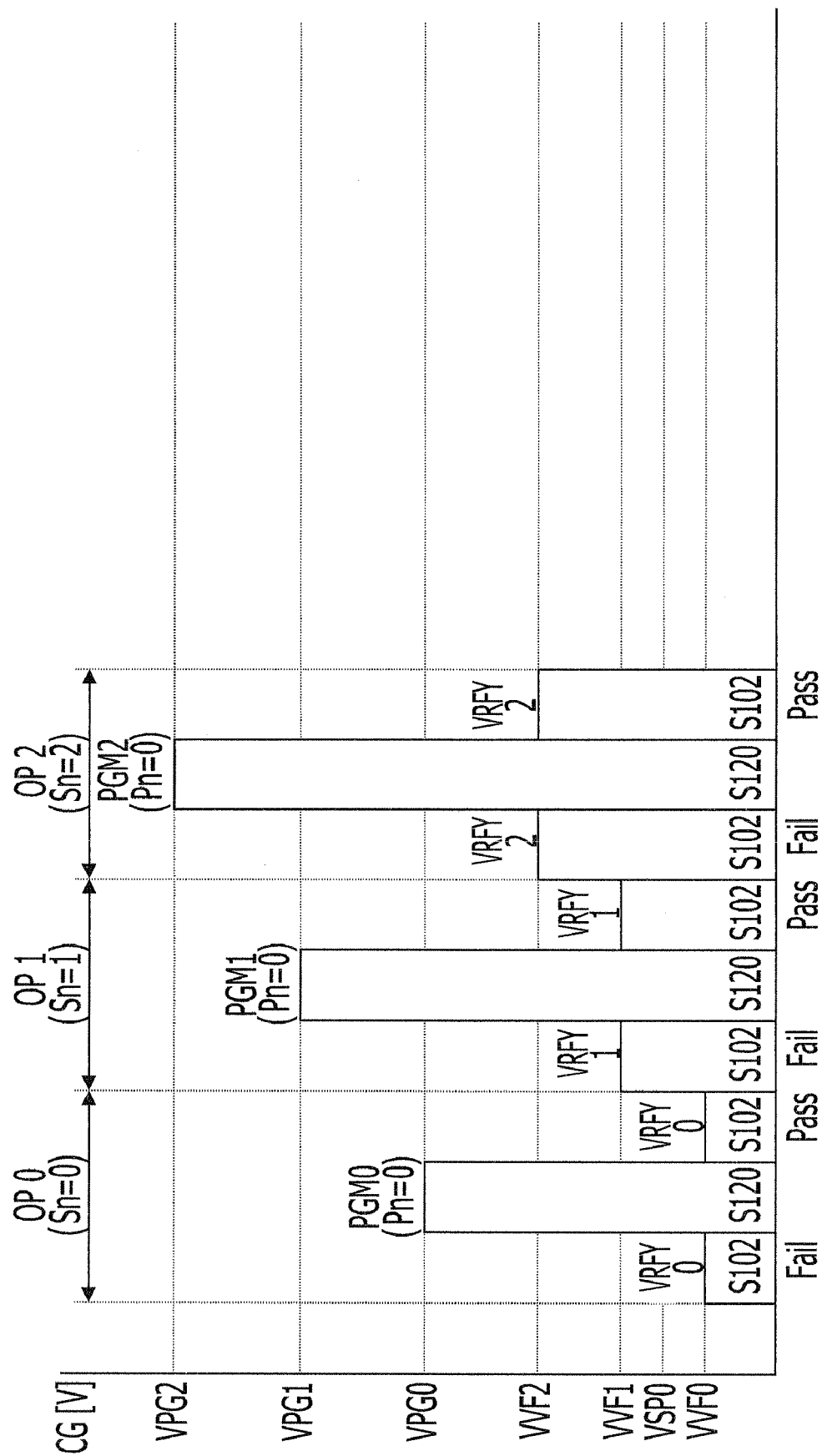
FIG. 8 illustrates an exemplary voltage setting sequence.

FIG. 8 illustrates an exemplary voltage setting sequence. The voltage setting sequence illustrated in FIG. 8 may be run in a write operation in the semiconductor memory illustrated in FIG. 2. The operation numbers S102 and S120 illustrated in FIG. 8 may correspond to operations illustrated in FIG. 7. The operations OP0-OP2 pass in the verify operations VRFY0-VRFY2 after the normal program operations PGM0-PGM2 are performed once, respectively. Because the number Fn of fails illustrated in FIG. 7 is not two or more, the soft program operation SPGM may not be performed.

Figure 9:
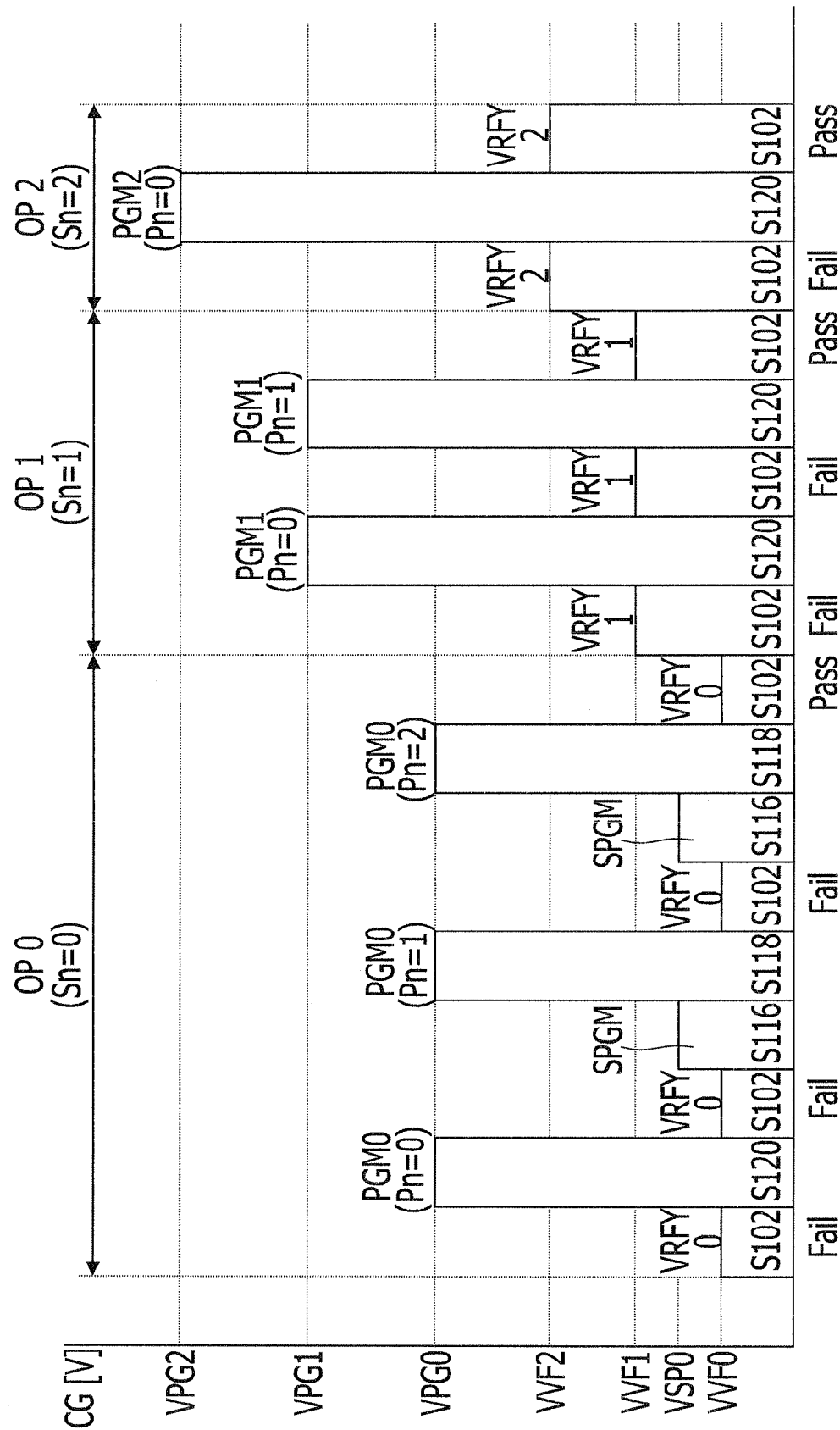
FIG. 9 illustrates an exemplary voltage setting sequence.

FIG. 9 illustrates an exemplary voltage setting sequence. The voltage setting sequence illustrated in FIG. 9 may be run in a write operation in the semiconductor memory illustrated in FIG. 2. The operation numbers S102, S116, S118, and S120 illustrated in FIG. 9 may correspond to operations illustrated in FIG. 7. In the operation OP0, the normal program operation PGM0 may be performed three times. The soft program operation SPGM is inserted before the second and third normal program operations PGM0.

In the operation OP1, the normal program operation PGM1 may be performed twice. In the operation OP1, depending on specifications of the state machine 30, the soft program operation SPGM may not be inserted. In the operation OP2, determination of a pass may be made in the verify operation VRFY2 after the normal program operation PGM2.

Figure 10:
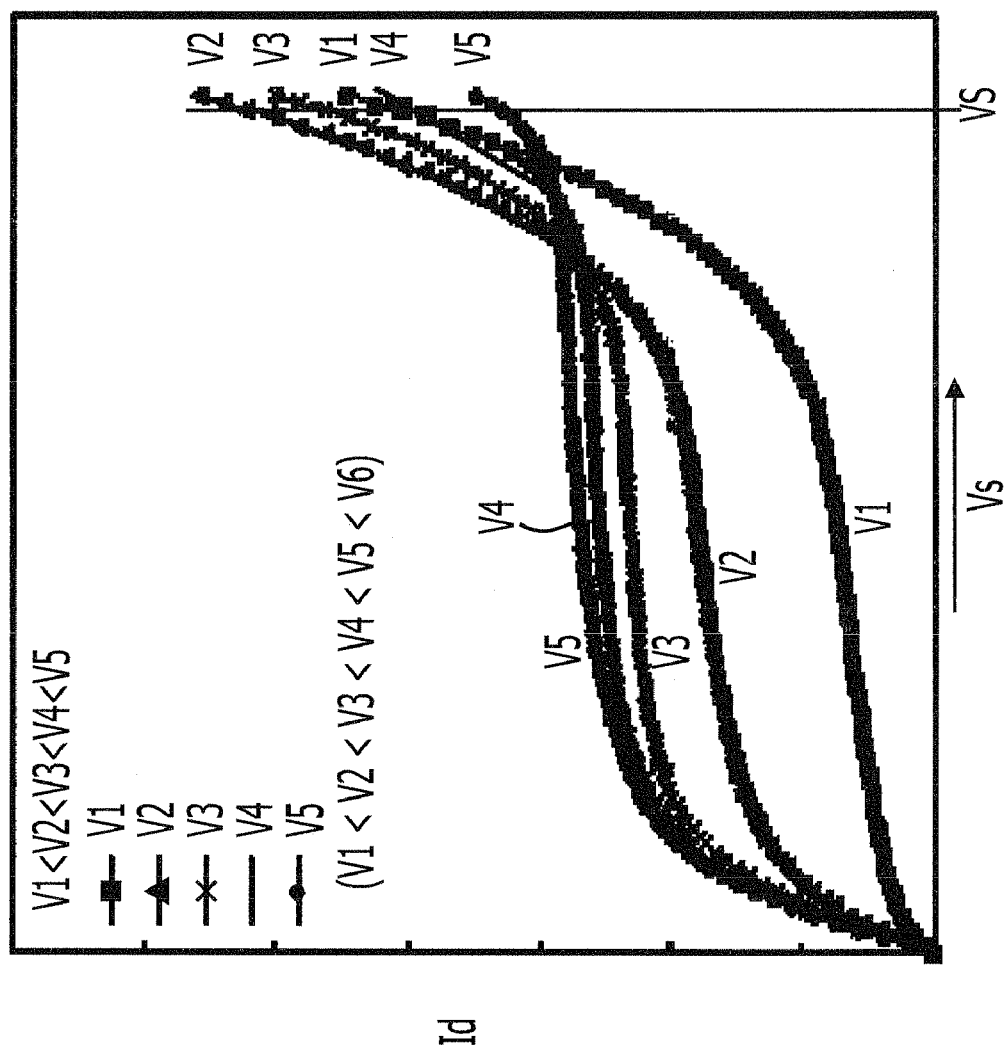
FIG. 10 illustrates an exemplary program characteristic of a memory cell.

FIG. 10 illustrates an exemplary program characteristic of a memory cell. The memory cell illustrated in FIG. 10 may be a memory cell of the semiconductor memory illustrated in FIG. 2. In FIG. 10, the horizontal axis indicates a source voltage Vs, and the vertical axis indicates a drain current Id. The source voltage VS may be used in the normal program operations PGM0-PGM2 and in the soft program operation SPGM. The drain current Id may be a current that flows between the source and drain of a memory transistor MT. Each of the voltages V1-V5 indicates an overdrive voltage. The overdrive voltage may be a value obtained by subtracting the threshold voltage of the memory transistor MT from the voltage of the control gate line CG. The overdrive voltage indicates a gate voltage applied to the memory transistor MT.

When the drain current Id is large, a hot electron may occur. The hot electron is used in the normal program operations PGM0-PGM2 and the soft program operation SPGM. If the overdrive voltage is too low or too high, the drain current Id is small. The optimal overdrive voltage may be V2 or V3 illustrated in FIG. 10.

For example, when the threshold voltage of a memory transistor MT in an erased state is low, the overdrive voltage in the normal program operation PGM0 is high. The drain current Id is small, and no hot electron may occur. Thus, the threshold voltage of the memory transistor MT may not change. Performing the soft program operation SPGM may cause the overdrive voltage to become relatively low, and the threshold voltage of the memory transistor MT may change. For example, when the overdrive voltage in the normal program operation PGM0 is V5, the overdrive voltage in the soft program operation SPGM may be set at V3. The threshold voltage of the memory transistor MT rises to a certain value by a small number of program operations. The logic "0" is written in the memory cell MC by a small number of program operations.

Figure 11:
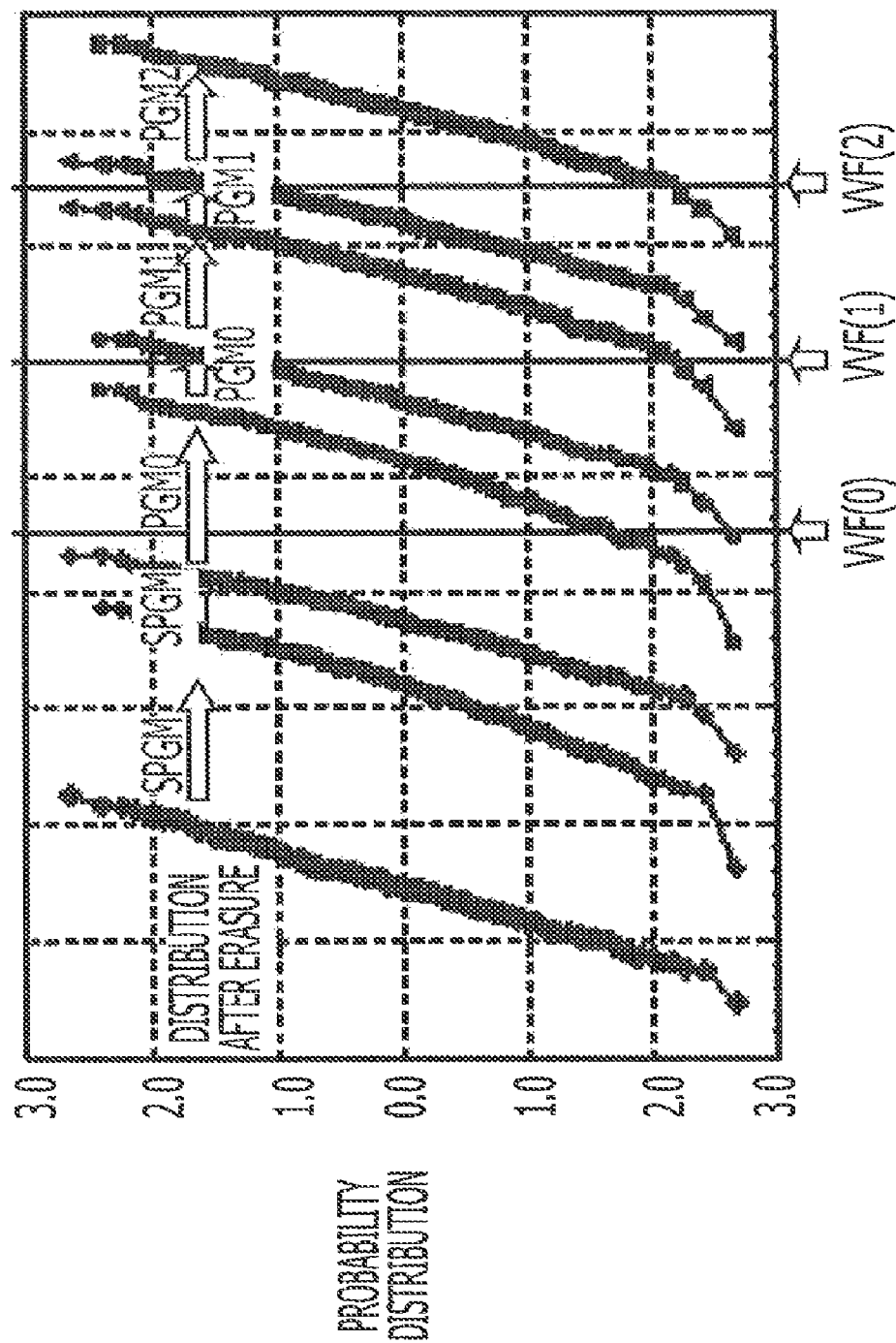
FIG. 11 illustrates an exemplary threshold voltage of a memory transistor.

FIG. 11 illustrates an exemplary threshold voltage of a memory transistor. The memory transistor illustrated in FIG. 11 may be a memory transistor MT of the semiconductor memory illustrated in FIG. 2. The threshold voltage illustrated in FIG. 11 may be the threshold voltage in a write operation. In FIG. 11, the horizontal axis indicates a threshold voltage, and the vertical axis indicates a probability distribution of a standardized memory cell MC. VVF(0)-VVF(2) indicate the verify voltages which are generated in response to the verify signals VRFY0-VRFY2, respectively.

Each of the soft program operation SPGM, normal program operation PGM0, and normal program operation PGM1 is performed twice on the memory cell MC in an erased state, and finally, the normal program operation PGM2 is performed thereon. Performing the soft program operation SPGM on the memory cell MC in an erased state changes the threshold voltage largely. In a write operation from an erased state, the soft program operation SPGM may be inserted.

Figure 12:
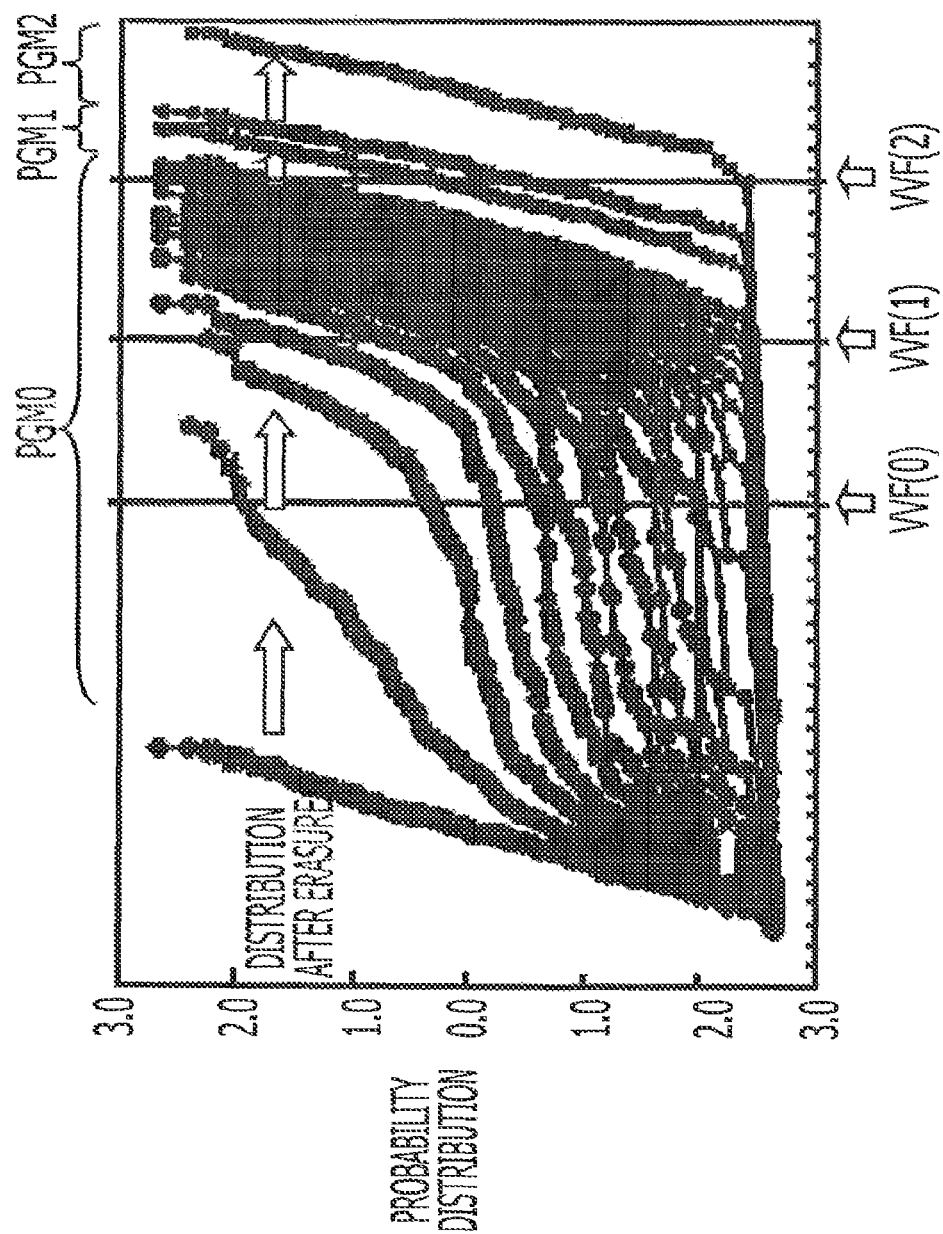
FIG. 12 illustrates an exemplary threshold voltage of a memory cell.

FIG. 12 illustrates an exemplary threshold voltage of a memory cell. The threshold voltage illustrated in FIG. 12 may be a threshold voltage when the soft program SPGM is not used in a write operation in the semiconductor memory illustrated in FIG. 2. In FIG. 12, the horizontal axis indicates a threshold voltage, and the vertical axis indicates a probability distribution of a standardized memory cell MC. VVF(0)-VVF (2) indicate the verify voltages which are generated in response to the verify signals VRFY0-VRFY2, respectively.

Changes in the threshold voltage of the memory cell MC in an erased state where the normal program operation PGM0 is repeatedly performed may be small because the overdrive voltage is high. When the maximum value MAXp of the number Pn of program operations is "2," for example, in operation S112 illustrated in FIG. 7, a write operation may fail.

Figure 13:
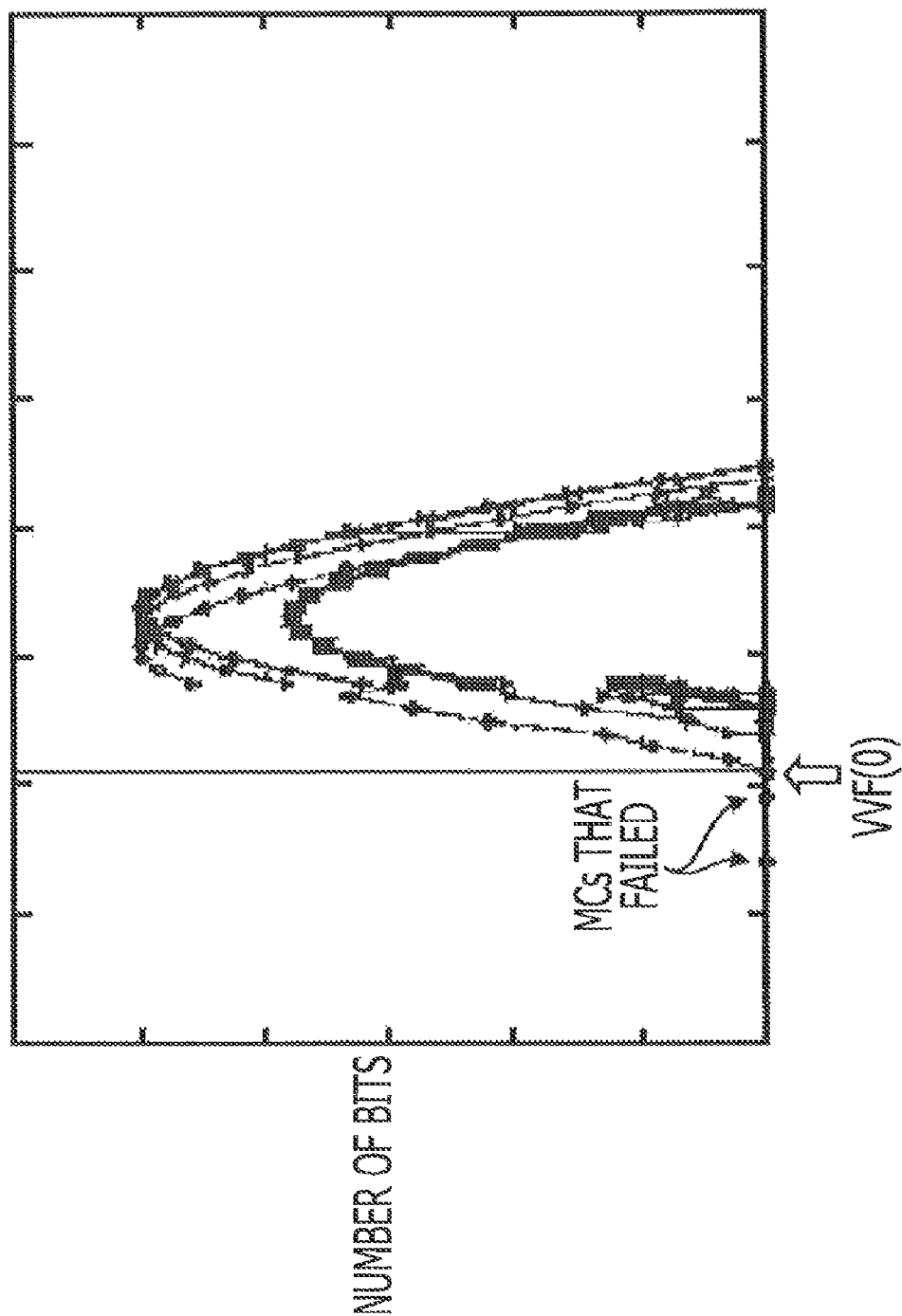
FIG. 13 illustrates an exemplary threshold voltage of a memory cell.

FIG. 13 illustrates an exemplary threshold voltage of a memory cell. The threshold voltage illustrated in FIG. 13 may be a threshold voltage of a memory cell on which the normal program operation PGM0 is performed in a write operation in the semiconductor memory illustrated in FIG. 2 without using the soft program. The number of samples may be 10. In FIG. 13, the horizontal axis indicates a threshold voltage, and the vertical axis indicates a number of bits. VVF(0) indicates the verify voltage which is generated in response to the verify signal VRFY0.

The normal program operation PGM0 is performed three times and the overdrive voltage is high, so the memory cell MC is determined to fail. If the soft program operation SPGM is performed and the overdrive voltage is reduced, the number of memory cells MC that have failed may be reduced.

The semiconductor memory illustrated in FIG. 2 may provide advantageous effects substantially the same as or similar to those in the above aspects. The amount of threshold voltage shift of the semiconductor memory MEM may be substantially equal to the normal program voltage VPG0 applied in the operation OP0. For a memory transistor MT in an erased state, the overdrive voltage in the normal program operation PGM0 may be relatively high, and the number of memory transistors MT each having a small amount of threshold voltage shift is small may be increased. The soft program operation SPGM is inserted depending on determination in the verify operation VRFY0, and the number of times the normal program operation PGM0 is performed and that for the verify operation VRFY0 may be reduced.

For example, the amount of threshold voltage shift in each of the operations OP1-OP2 may be standard.

Figure 14:
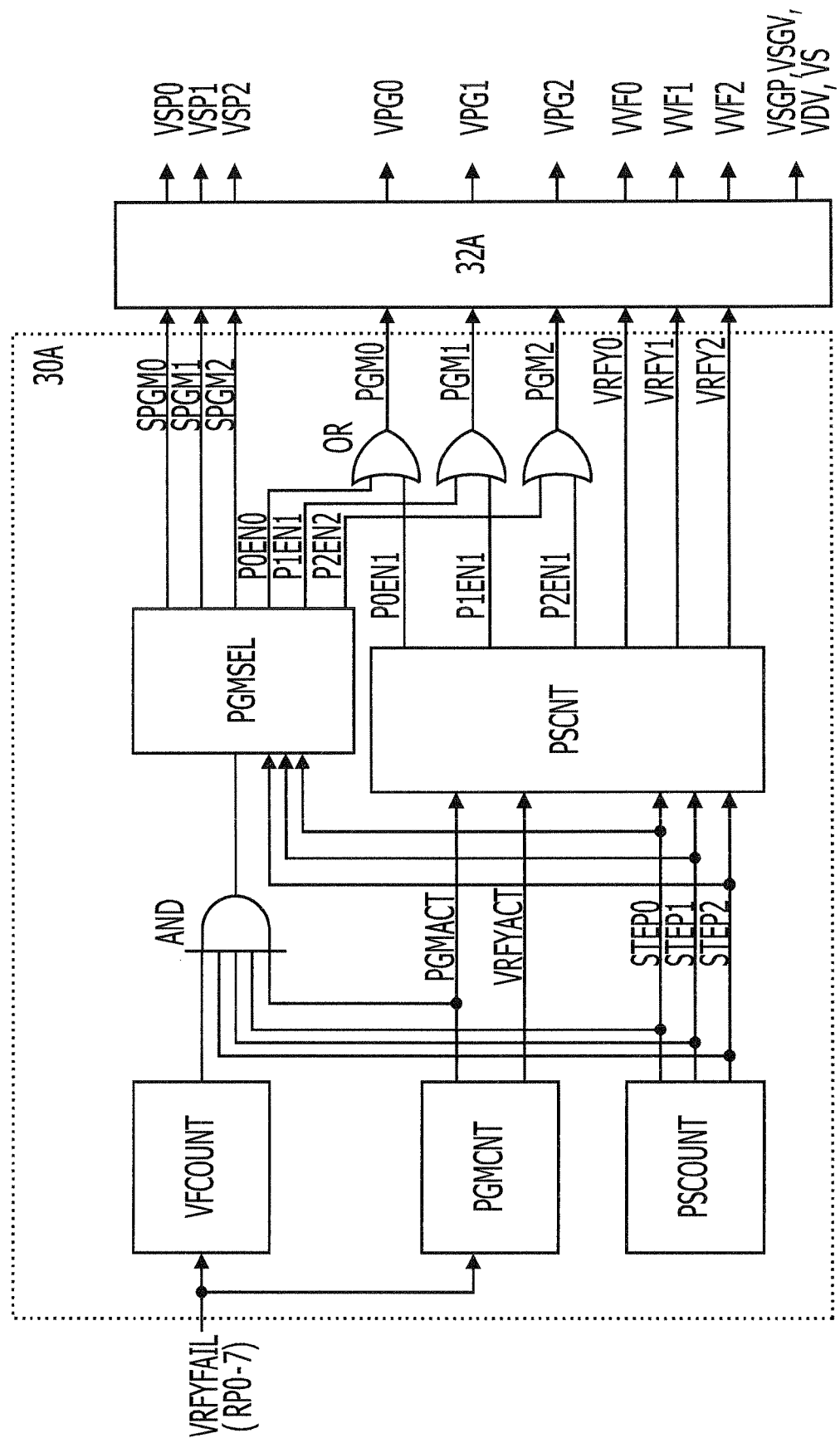
FIG. 14 illustrates an exemplary state machine.

FIG. 14 illustrates an exemplary state machine. In FIG. 14, the same reference numerals are used for elements substantially the same as or similar to the above elements, and the detailed description thereof may be omitted or reduced. A state machine 30A illustrated in FIG. 14 includes an AND circuit and a program selector PGMSEL that are different from those in the state machine 30 illustrated in FIG. 4. OR circuits are provided for normal program signals PGM0-PGM2. The other configuration may be substantially the same as or similar to that illustrated in FIG. 2 or 3. A voltage generating circuit 32A generates the control voltage similarly to the voltage generating circuit 32 illustrated in FIG. 2. The semiconductor memory MEM may be a nonvolatile semiconductor memory, such as a flash memory.

The AND circuit operates in response to a program active signal PGMACT and operation signals STEP0-STEP2. When a verify operation fails two or more times during the normal program operations PGM0-PGM2 in the operations OP0-OP2, the AND circuit outputs a high-level signal to the program selector PGMSEL.

When receiving a high-level signal from the AND circuit, the program selector PGMSEL operates. When receiving the high-level signal from the AND circuit and the operation signal STEP0, the program selector PGMSEL outputs the soft program signal SPGM0 and program enable signal P0EN0. When receiving the high-level signal from the AND circuit and the operation signal STEP1, the program selector PGMSEL outputs the soft program signal SPGM1 and program enable signal P1EN0. When receiving the high-level signal from the AND circuit and the operation signal STEP2, the program selector PGMSEL outputs the soft program signal SPGM2 and program enable signal P2EN0.

When the program enable signal P0EN0 or P0EN1 is at a high level, the OR circuit coupled to the normal program signal line PGM0 outputs the high-level normal program signal PGM0. When the program enable signal P1EN0 or P1EN1 is at a high level, the OR circuit coupled to the normal program signal line PGM1 outputs the high-level normal program signal PGM1. When the program enable signal P2EN0 or P2EN1 is at a high level, the OR circuit coupled to the normal program signal line PGM2 outputs the high-level normal program signal PGM2. When a verify operation fails two or more times during each of the normal program operations PGM0-PGM2 in the operations OP0-OP2, the soft program operation SPGM may be inserted before the normal program operations PGM0-PGM2.

FIG. 15 illustrates an exemplary internal voltage. The internal voltage illustrated in FIG. 15 may be the internal voltage of a semiconductor memory that includes the state machine 30A illustrated in FIG. 14. The soft program operations SPGM0-SPGM2 may be performed for the respective operations OP0-OP2. In the soft program operations SPGM0-SPGM2, the control gate line CG is set at the voltages VSP0-VSP2, respectively. The other voltages may be substantially the same as or similar to those illustrated in FIG. 6.

Figure 16:
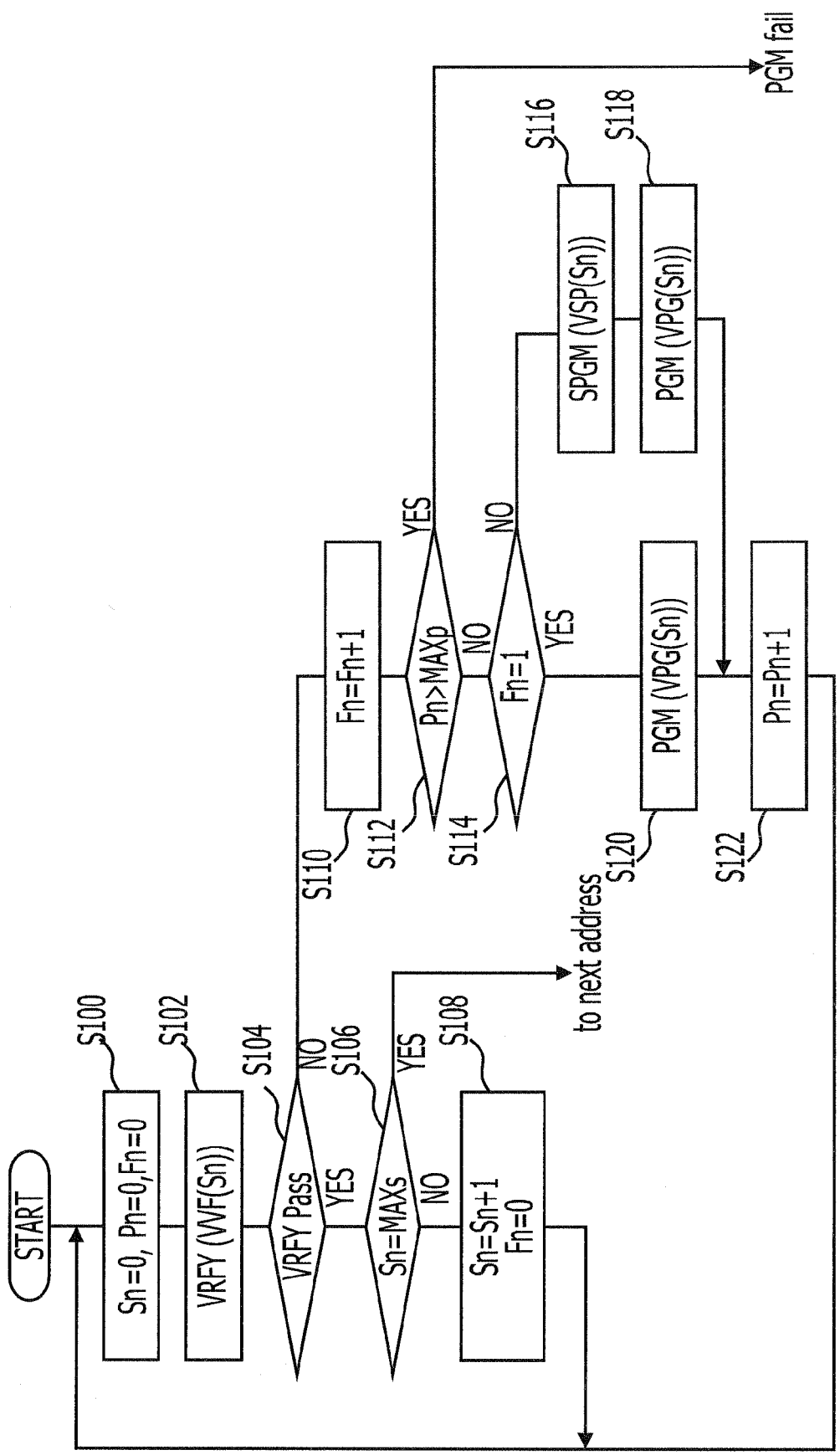
FIG. 16 illustrates an exemplary write operation.

FIG. 16 illustrates an exemplary write operation. A semiconductor memory that includes the state machine 30A illustrated in FIG. 14 may execute the write operation illustrated in FIG. 16. The write operation illustrated in FIG. 16 may not include the operation S115 illustrated in FIG. 7. In FIG. 16, in the operations OP0-OP2, the soft program operations SPGM0-SPGM2 may be inserted. The other operations may be substantially the same as or similar to those illustrated in FIG. 7.

Figure 17:
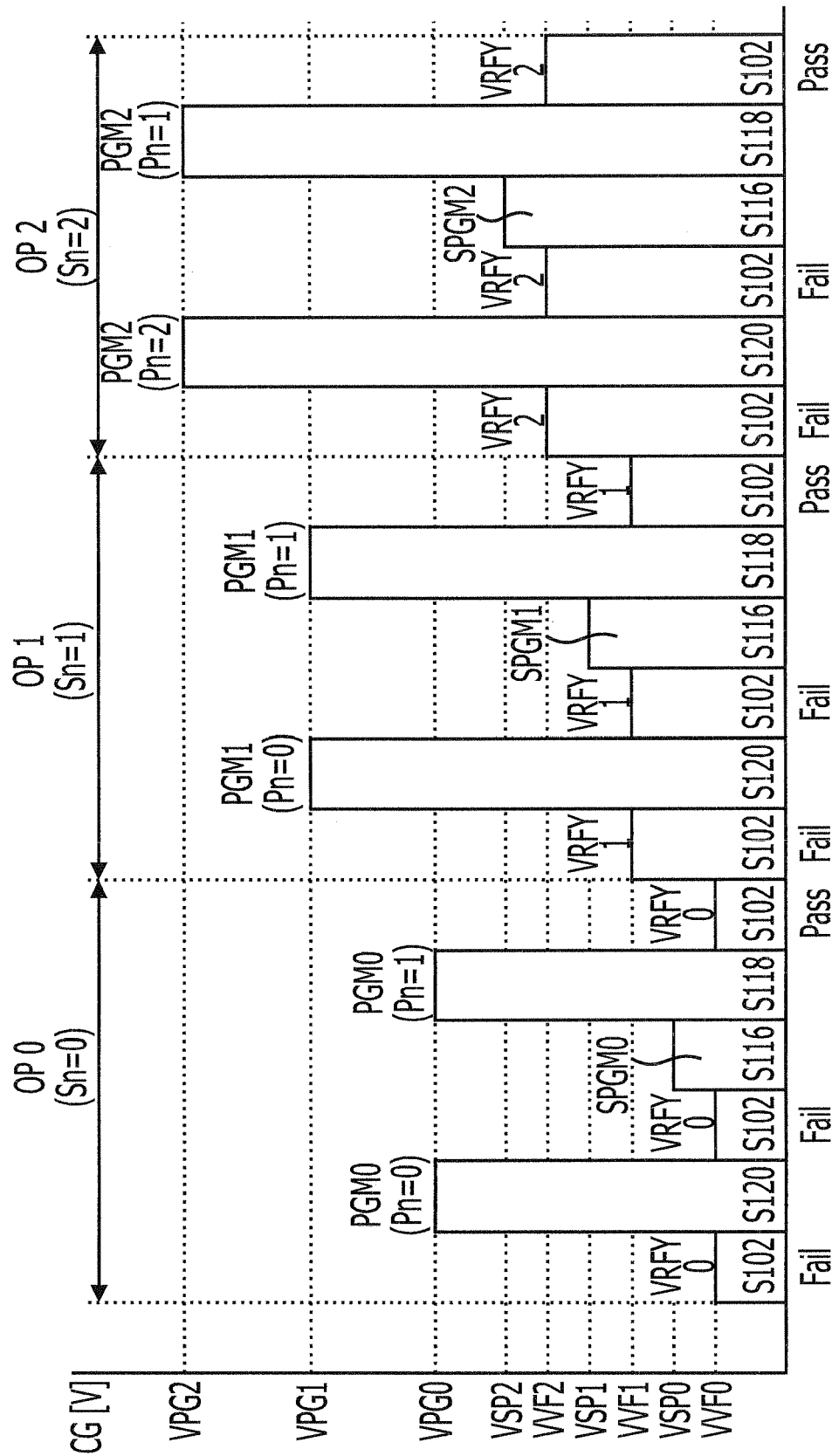
FIG. 17 illustrates an exemplary control-voltage setting sequence.

FIG. 17 illustrates an exemplary control-voltage setting sequence. A semiconductor memory that includes the state machine illustrated in FIG. 14 may perform the control-voltage setting sequence illustrated in FIG. 17. The operation numbers S102, S116, S118, S120, and S130 may correspond to the processes illustrated in FIG. 16. In the operations OP1-OP2, the soft program operations SPGM1-SPGM2 may be performed. In the operation OP, two normal program operations PGM0 and one soft program operation SPGM0 may enable the verify operation VRFY0 to pass.

The verify operation VRFY1 after the normal program operation PGM1 or the verify operation VRFY2 after the normal program operation PGM2 fails, and the soft program operation SPGM1 or SPGM2 is inserted. The normal program operation PGM1 after the soft program operation SPGM1 or the normal program operation PGM2 after the soft program operation SPGM2 sets the threshold voltage of the memory transistor MT at a certain value, and the verify operation VRFY1 or the verify operation VRFY2 may pass.

The above-described semiconductor memory may provide advantageous effects substantially the same as or similar to those in the above aspects. For example, the amount of threshold voltage shift may be substantially equal to each of the normal program voltages VPG0-VGP2 applied in the operations OP0-OP2, respectively. For the semiconductor memory MEM including the memory transistor MT having these electric characteristics, the soft program operation SPGM may be inserted in the operations OP1-OP2. The number of times the normal program operations PGM0-PGM2 are performed and that for the verify operations VRFY0-VRFY2 may be reduced, and the time period for writing may be reduced.

Figure 18:
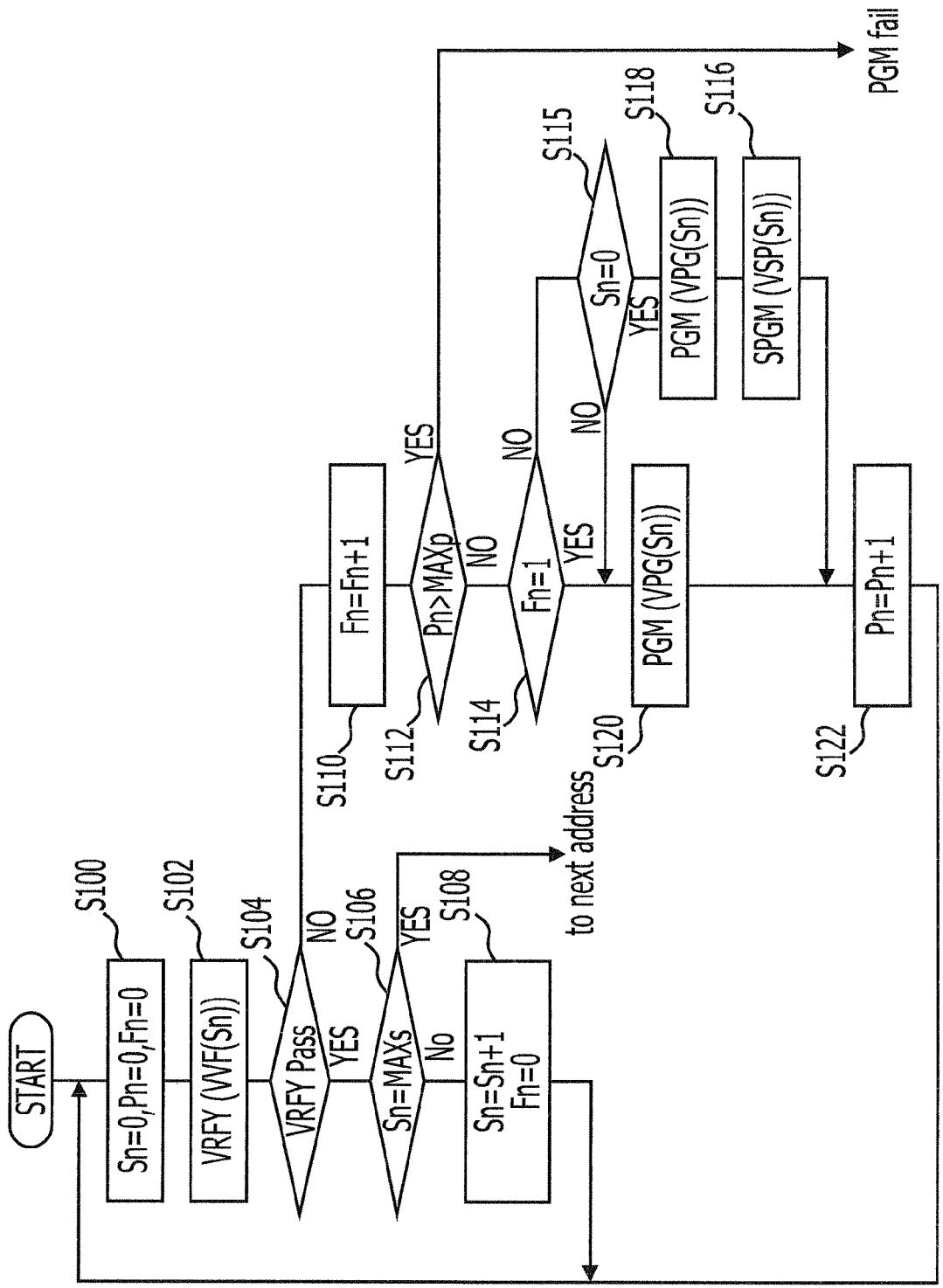
FIG. 18 illustrates an exemplary write operation.

FIG. 18 illustrates an exemplary write operation. In the write operation illustrated in FIG. 18, the operation S116 and the operation S118 illustrated in FIG. 7 are interchanged. The soft program operation SPGM is inserted after the normal program operation PGM. The other process may be substantially the same as or similar to that illustrated in FIG. 7. The elements of the semiconductor memory MEM may be substantially the same as those illustrated in FIG. 2 or 3. The semiconductor memory MEM may be a nonvolatile semiconductor memory, such as a flash memory. The write operation illustrated in FIG. 18 may not include the operation S115. In the write operation illustrated in FIG. 18, the operation S116 and the operation S118 illustrated in FIG. 16 may be interchanged.

Figure 19:
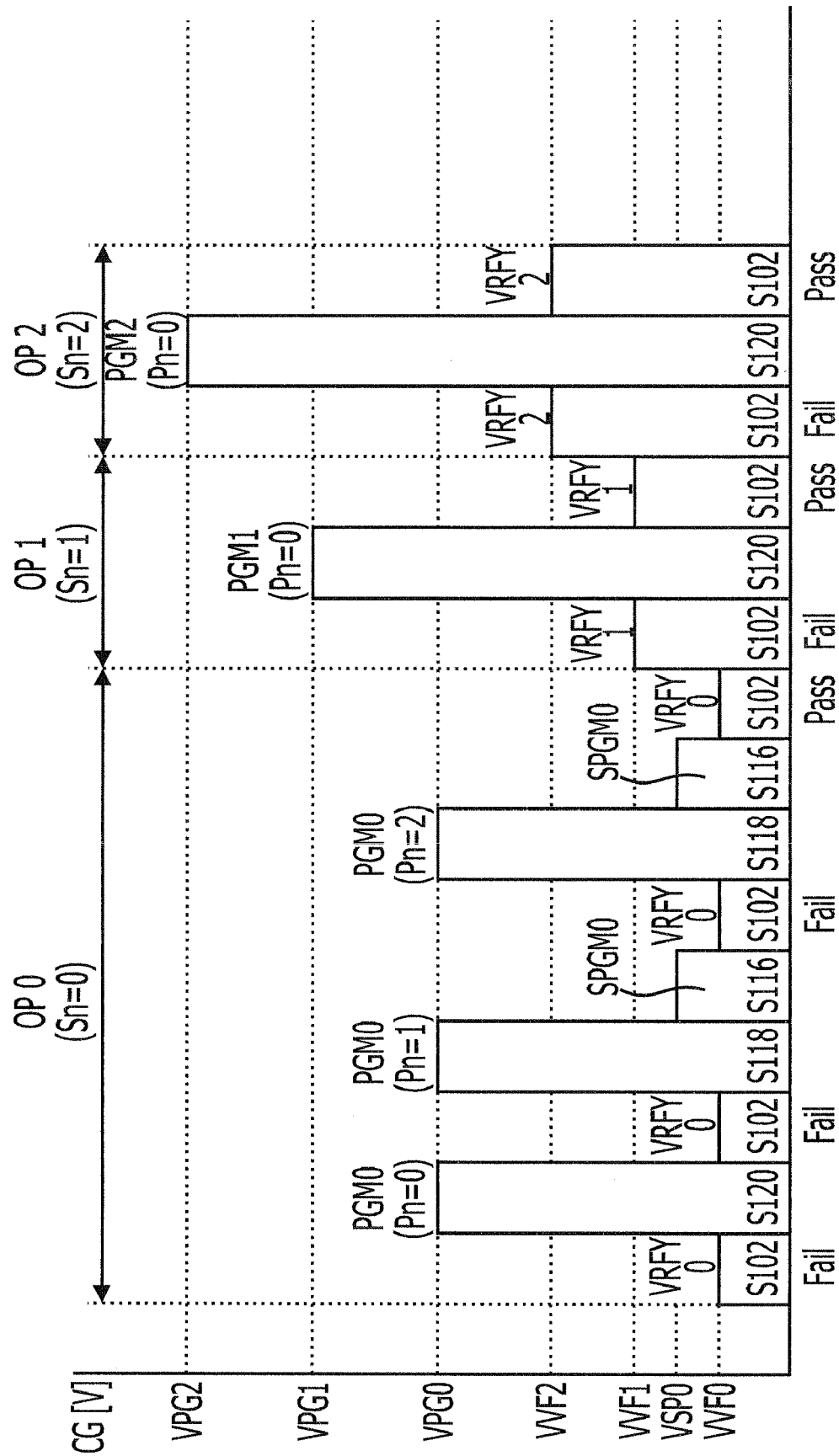
FIG. 19 illustrates an exemplary control-voltage setting sequence.

FIG. 19 illustrates an exemplary control-voltage setting sequence. The sequence illustrated in FIG. 19 may be performed in a write operation. The semiconductor memory illustrated in FIG. 18 may perform the control-voltage setting sequence illustrated in FIG. 19. The operations S102, S116, S118, and S120 may correspond to the processes illustrated in FIG. 18. When the second verify operation VRFY0 fails, the normal program operation PGM0 is performed, and after that, the soft program operation SPGM0 is performed. The first soft program operation SPGM0 is performed after the normal program operation PGM is performed twice. The operations OP1-OP2 may be substantially the same as or similar to those illustrated in FIG. 8.

The above-described semiconductor memory may provide advantageous effects substantially the same as or similar to those in the above aspects. When a new state machine is designed using an existing state machine logic, the control gate voltages VPG(Sn) and VSP(Sn) may preferably be applied in the order of the operations S118 and S116 illustrated in FIG. 18. Designing a state machine that uses the write operation illustrated in FIG. 18 may reduce the period of time required for the design.

Figure 20:
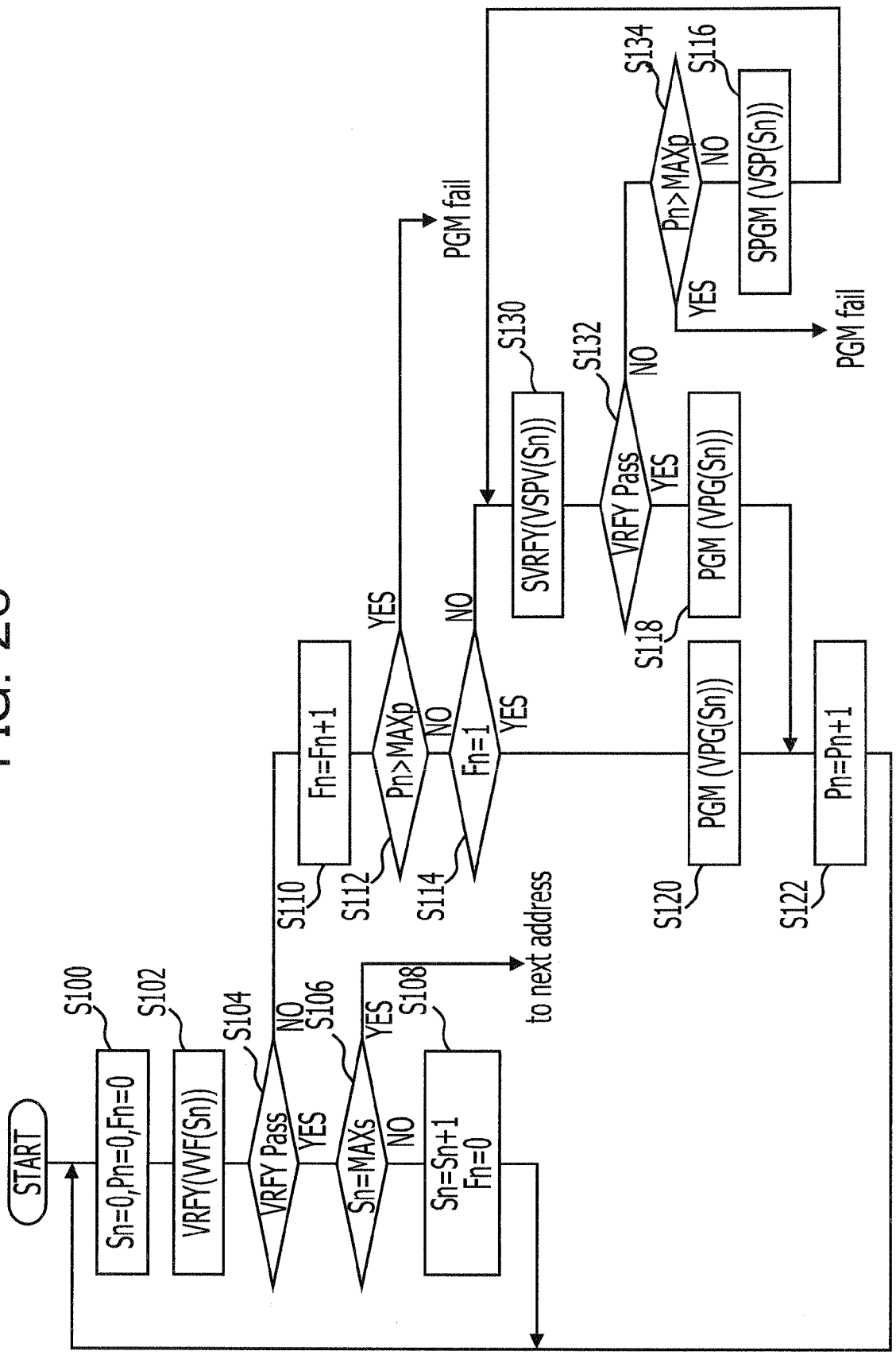
FIG. 20 illustrates an exemplary write operation.

FIG. 20 illustrates an exemplary write operation. The write operation illustrated in FIG. 20 includes operations S130, S132, and S134 before the operations S116 and S118 illustrated in FIG. 16. A soft verify operation SVRFY is performed so as to correspond to the soft program operations SPGM0-2. The other process may be substantially the same as or similar to that illustrated in FIG. 16. The elements of the semiconductor memory MEM may be substantially the same as or similar to those illustrated in FIG. 2 or 3. The semiconductor memory MEM may be a nonvolatile semiconductor memory, such as a flash memory. At least one of the operations S130, S132, and S134 may be added between the operations S115 and S116 illustrated in FIG. 7. At least one of the operations S130, S132, and S134 may be added between the operations S115 and S116 illustrated in FIG. 18.

In the operation S130, the control gate line CG is set at a soft verify voltage VSPV(Sn), and the soft verify operation SVRFY is performed. In the operation S132, when the soft verify operation SVRFY passes, the process proceeds to the operation S118. When the soft verify operation SVRFY fails in the operation S132, the process proceeds to the operation S134.

In the operation S134, when the number Pn of program operations exceeds the maximum value MAXp, the normal program operation PGM is determined to fail. When the number Pn of program operations does not exceed the maximum value MAXp, the process proceeds to the operation S116 to perform the soft program operation SPGM.

In response to a software verify signal generated by the state machine, the voltage generating circuit 32 generates the software verify voltage VSPV(Sn). The state machine generates the soft verify signal. The state machine alternately generates soft program signals SPGM0-SPGM2 and the soft verify signal until the soft verify operation SVRFY passes. The soft program operation SPGM performs the soft verify operation SVRFY of checking whether the threshold voltage is set at a certain value based on the soft verify signal.

The voltage generating circuit generates the soft verify voltage VSPV(Sn). In response to the soft verify signal, the voltage generating circuit generates the soft verify voltage VSPV(Sn) as the control gate voltage VCG.

Figure 21:
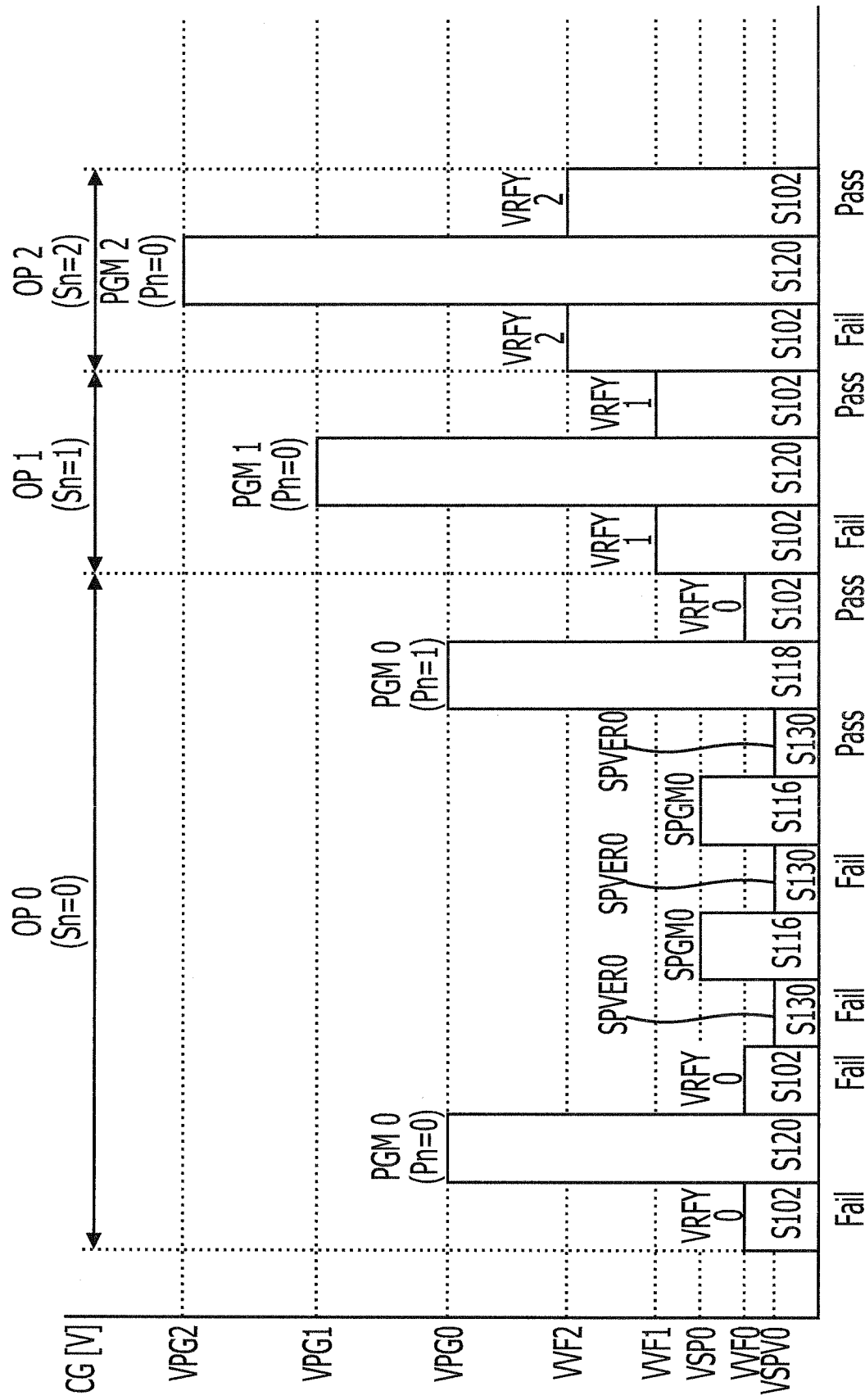
FIG. 21 illustrates an exemplary control-voltage setting sequence.

FIG. 21 illustrates an exemplary control-voltage setting sequence. The semiconductor memory illustrated in FIG. 20 may perform the control-voltage setting sequence illustrated in FIG. 21. The control-voltage setting sequence illustrated in FIG. 21 may be performed in a write operation. The operation numbers S102, S116, S118, S120, and S130 may correspond to the process illustrated in FIG. 20. In the operation OP0, when the second verify operation VRFY0 fails, the voltage applied to the control gate line CG is reduced to VSPV0, and the soft verify operation SVRFY0 is performed. The soft program operation SPGM0 is performed until the soft verify operation SVRFY0 passes. The operations OP1-OP2 may be substantially the same as or similar to those illustrated in FIG. 8.

The above-described semiconductor memory may provide advantageous effects substantially the same as or similar to those in the above aspects. The soft verify operations SVRFY0-SVRFY2 are performed for the respective soft program operations SPGM0-SPGM2, and the threshold voltage may be adjusted precisely. For example, the embodiments may be applied in a multi-level semiconductor memory MEM that stores at least one of three or more logical values.

Figure 22:
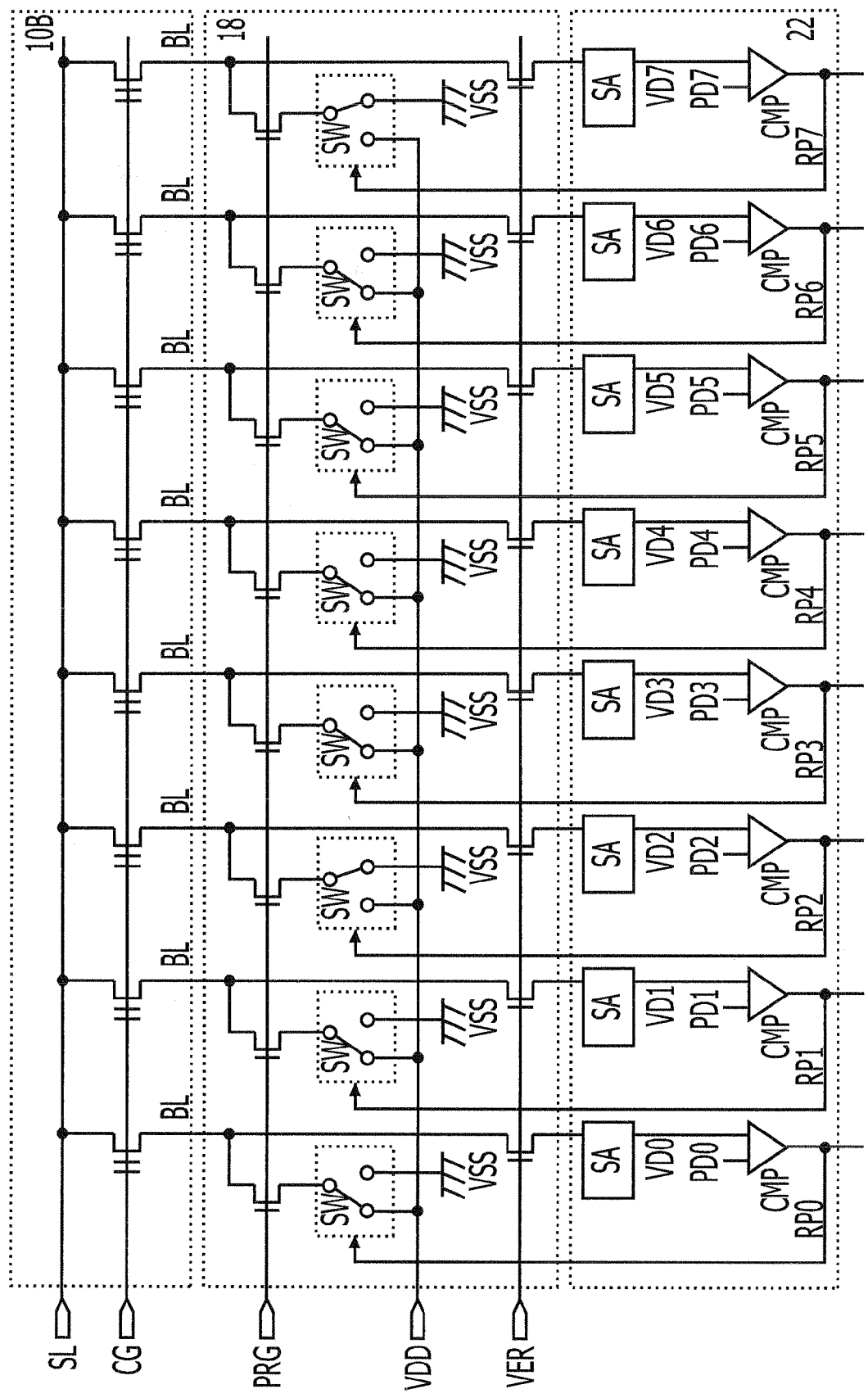
FIG. 22 illustrates an exemplary memory cell array, an exemplary Y decoder, and an exemplary sense amplifier.

FIG. 22 illustrates an exemplary memory cell array, Y decoder, and sense amplifier. The memory cell array 10B includes a plurality of nonvolatile memory cells MC arranged in a matrix. Each of the memory cells MC may not include a selection transistor ST and may include a memory transistor MT. The selection gate line SG may not be arranged. The other configuration may be substantially the same as or similar to that illustrated in FIG. 2 or 3. That is, the semiconductor memory MEM may be a nonvolatile semiconductor memory, such as a flash memory.

FIG. 23 illustrates an exemplary internal voltage. The internal voltage illustrated in FIG. 23 may be an internal voltage of the semiconductor memory illustrated in FIG. 22. Each of the memory cells MC of the semiconductor memory MEM illustrated in FIG. 22 may not include a selection transistor ST. The voltage generating circuit 32 may not generate a voltage for the selection gate line SG. In the soft program operation SPGM and the normal program operations PGM0-PGM2, the bit line BL may be set at a drain voltage VDP, and the source line SL may be set at the ground voltage VSS (0 V). For example, the drain voltage VDP may be approximately 5 volts. The other voltages may be substantially the same as or similar to those illustrated in FIG. 6. The above-described semiconductor memory may provide advantageous effects substantially the same as or similar to those in the above aspects.

Figure 24:
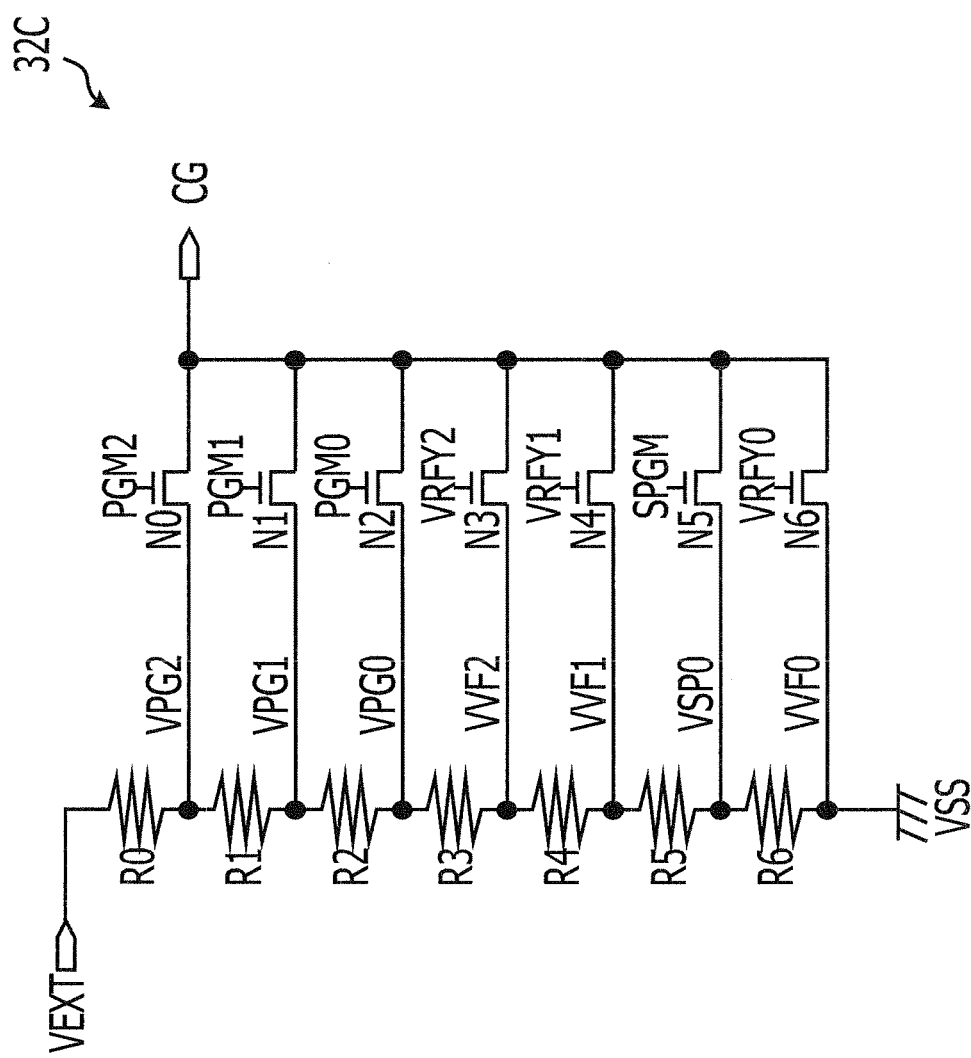
FIG. 24 illustrates an exemplary voltage generating circuit.

FIG. 24 illustrates an exemplary voltage generating circuit. A voltage generating circuit 32C generates the control gate voltage CG to be supplied to the control gate line CG. The voltage generating circuit 32C includes a plurality of resistors R0-R6 coupled in series between a high-level voltage VEXT supplied through an external terminal of the semiconductor memory MEM and the ground line VSS. One of divided voltages VPG2-VPG0, VVF2-VVF1, VSP0, and VVF0, which are generated by resistance division, is selected by nMOS transistors N0-N6, and it is output as the control gate voltage CG. The high-level voltage VEXT is higher than the external power supply voltage VDD, and may be approximately 10 volts, for example.

The gates of the nMOS transistors N0-N6 receive the normal program signals PGM2-PGM0, verify signals VRFY2-VRFY1, soft program signal SPGM, and verify signal VRFY0, respectively, output from the state machine 30 illustrated in FIG. 4. The verify operation voltages VVF2-VVF0 and the soft program operation voltage VSP0 may be generated based on the external power supply voltage VDD.

Figure 25:
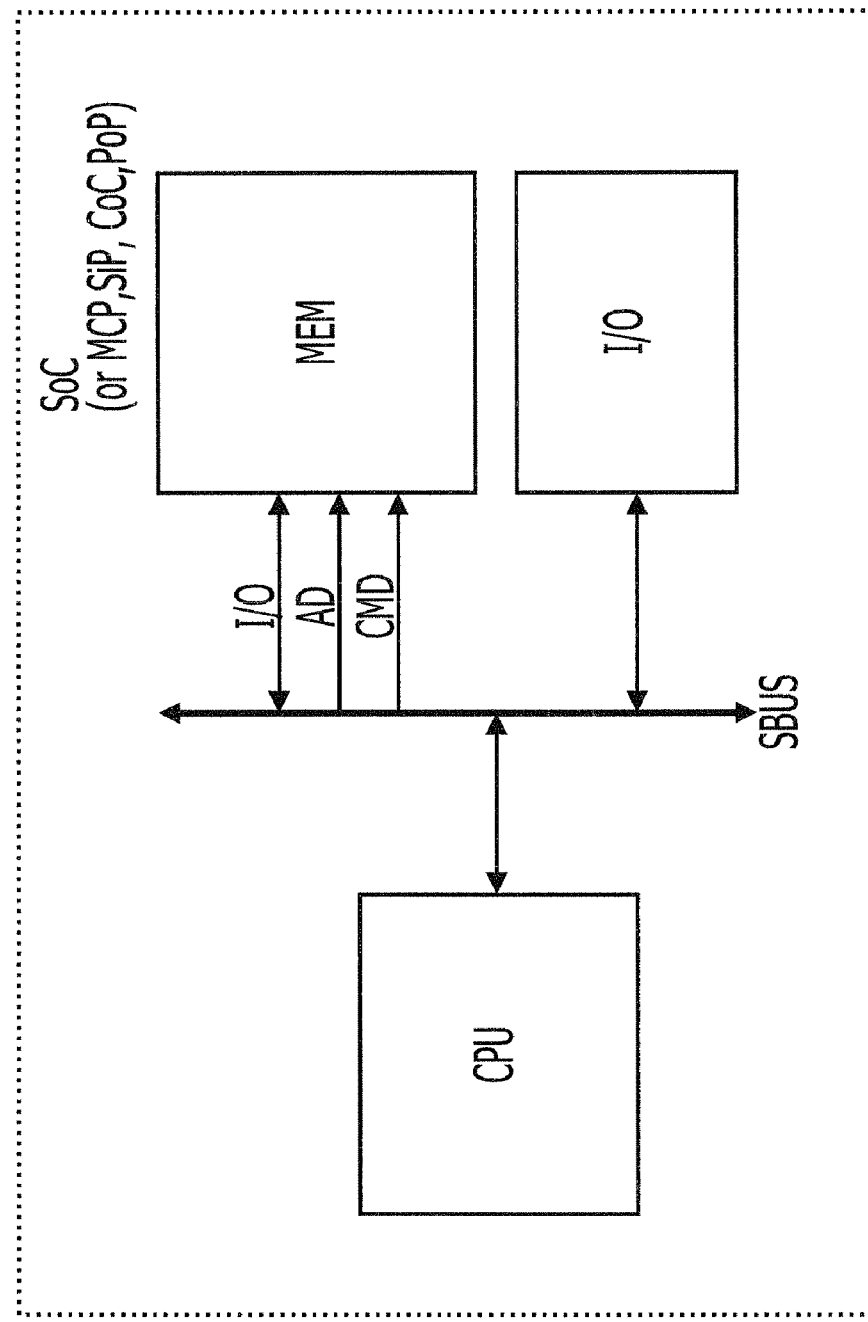
FIG. 25 illustrates an exemplary system.

FIG. 25 illustrates an exemplary system. The above-described semiconductor memory may be incorporated in the system illustrated in FIG. 25. A system SYS, for example, a user system may be included in a microcomputer system of a portable device, for example. The system SYS may include a system-on-a-chip (SoC) in which a plurality of macros are integrated on a silicon substrate. The system SYS may include a multi-chip package (MCP) in which a plurality of chips are laminated on a package substrate. The system SYS may include a system-in-a-package (SiP) in which a plurality of chips are integrated on a package substrate, such as a leadframe. The system SYS may include a chip-on-chip (CoC) or a package-on-package (PoP).

For example, the SoC includes a central processing unit (CPU) (controller), the semiconductor memory MEM of at least one of the above aspects, and a peripheral circuit I/O. The CPU, semiconductor memory MEM, and peripheral circuit I/O are coupled to each other by a system bus (SBUS). A memory controller may be disposed between the CPU and the semiconductor memory MEM.

The CPU accesses the semiconductor memory MEM and the peripheral circuit I/O and controls the system entirely. The semiconductor memory MEM performs a read operation, a write operation, and an erase operation in response to an access request from the CPU. The system SYS may include only the CPU and the semiconductor memory MEM.

The above aspects may be applied to a semiconductor memory MEM that stores at least one of three or more logical values in a memory cell MC.

Example embodiments of the present invention have now been described in accordance with the above advantages. It will be appreciated that these examples are merely illustrative of the invention. Many variations and modifications will be apparent to those skilled in the art.

The invention claimed is:

1. A semiconductor memory comprising:
a non-volatile memory cell configured to include a floating gate and a memory transistor; a state machine configured to generate a normal program signal to perform a normal program operation and a verify signal to perform a verify operation in a write operation and to generate a soft program signal to perform a soft program operation when detecting a fail in the verify operation after the normal program operation, whether a threshold voltage of the memory transistor reaches a certain value in the normal program operation being checked in the verify operation;
a voltage generating circuit configured to generate a normal program voltage and a verify voltage in response to the normal program signal and the verify signal respectively, and to generate a soft program voltage being lower than the normal program voltage in response to the soft program signal; and
a determination circuit configured to detect a pass when the threshold voltage reaches the certain value and to detect the fail when the threshold voltage does not reach the certain value in the verify operation.

2. The semiconductor memory according to claim 1, wherein the state machine generates the normal program signal and the verify signal until the pass is detected in the verify operation, and wherein the normal program voltage increases gradually and the verify voltage increases gradually.

3. The semiconductor memory according to claim 1, wherein the normal program voltage increases gradually, the verify voltage increases gradually, and the soft program voltage increases gradually.

4. The semiconductor memory according to claim 1, wherein the soft program operation is performed before the normal program operation after the fail is detected in the verify operation.

5. The semiconductor memory according to claim 1, wherein the soft program operation is performed after the normal program operation after the fail is detected in the verify operation.

6. The semiconductor memory according to claim 1, wherein the state machine generates the soft program signal and a soft verify signal for performing a soft verify operation, whether the threshold voltage is set to a certain value in the soft program operation being checked in the soft verify operation, and wherein the voltage generating circuit generates a soft verify voltage in response to the soft verify signal.

7. A system comprising: a semiconductor memory; and a controller configured to control the semiconductor memory, wherein the semiconductor memory includes: a non-volatile memory cell configured to include a floating gate and a memory transistor;
a state machine configured to generate a normal program signal to perform a normal program operation and a verify signal to perform a verify operation in a write operation and to generate a soft program signal to perform a soft program operation when detecting a fail in the verify operation after the normal program operation, whether a threshold voltage of the memory transistor reaches a certain value in the normal program operation being checked in the verify operation;
a voltage generating circuit configured to generate a normal program voltage and a verify voltage in response to the normal program signal and the verify signal respectively, and to generate a soft program voltage being lower than the normal program voltage in response to the soft program signal; and a determination circuit configured to detect a pass when the threshold voltage reaches the certain value and to detect the fail when the threshold voltage does not reach the certain value in the verify operation.

8. A method of controlling a semiconductor memory, the method comprising:

generating, in a write operation for a non-volatile memory cell including a floating gate and a memory transistor, a normal program signal for performing a normal program operation and a verify signal for performing a verify operation, whether a threshold voltage of the memory transistor reaches a certain value in the normal program operation being checked in the verify operation;

generating a soft program signal for performing a soft program operation when detecting a fail in the verify operation after the normal program operation;

generating a normal program voltage and a verify voltage in response to the normal program signal and the verify signal, respectively, as a control gate voltage of the memory transistor; generating a soft program voltage being lower than the normal program voltage in response to the soft program signal, as the control gate voltage; and detecting a pass when the threshold voltage reaches the certain value and detecting the fail when the threshold voltage does not reach the certain value in the verify operation.

9. The method of controlling a semiconductor memory according to claim 8, wherein the write operation is performed in a plurality of operations, wherein the normal program signal and the verify signal are generated for each of the plurality of operations, and wherein the normal program voltage increases gradually for each of the plurality of operations and the verify voltage increases gradually for each of the plurality of operations are generated.

10. The method of controlling a semiconductor memory according to claim 8, wherein the write operation is performed in a plurality of operations, wherein the normal program signal, the verify signal, and the soft program signal are generated for each of the plurality of operations, and wherein the normal program voltage increases gradually for each of the plurality of operations, the verify voltage increases gradually for each of the plurality of operations, and the soft program voltage increases gradually for each of the plurality of operations are generated.

11. The method of controlling a semiconductor memory according to claim 8, wherein the soft program operation is performed before the normal program operation after the fail is detected in the verify operation.

12. The method of controlling a semiconductor memory according to claim 8, wherein the soft program operation is performed after the normal program operation after the fail is detected in the verify operation.

13. The method of controlling a semiconductor memory according to claim 8, further comprising: generating the soft program signal and a soft verify signal for performing a soft verify operation, whether the threshold voltage is set to a certain value in the soft program operation being checked in the soft program operation; and generating a soft verify voltage in response to the soft verify signal.

14. The method of controlling a semiconductor memory according to claim 8, further comprising: detecting the pass in the verify operation when the threshold voltage of the memory transistor is set at the certain value for the memory cell; and prohibiting at least one of the normal program voltage and the soft program voltage from being applied to between a source and a drain of the memory transistor in the normal program operation and the soft program operation after the pass is detected in the verify operation.

* * * * *